US011050211B2

(12) United States Patent
Kawahara et al.

(10) Patent No.: US 11,050,211 B2
(45) Date of Patent: Jun. 29, 2021

(54) PULSED LASER DEVICE, PROCESSING DEVICE, AND METHOD OF CONTROLLING PULSED LASER DEVICE

(71) Applicant: FURUKAWA ELECTRIC CO., LTD., Tokyo (JP)

(72) Inventors: Ryo Kawahara, Tokyo (JP); Shunichi Matsushita, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 43 days.

(21) Appl. No.: 16/433,522

(22) Filed: Jun. 6, 2019

(65) Prior Publication Data

US 2019/0288479 A1 Sep. 19, 2019

Related U.S. Application Data

(63) Continuation of application No. PCT/JP2017/044212, filed on Dec. 8, 2017.

(30) Foreign Application Priority Data

Dec. 9, 2016 (JP) ............................ JP2016-238985

(51) Int. Cl.
*H01S 3/10* (2006.01)
*H01S 3/23* (2006.01)
(Continued)

(52) U.S. Cl.
CPC ........ *H01S 3/10084* (2013.01); *H01S 3/2308* (2013.01); *H01S 5/0085* (2013.01); (Continued)

(58) Field of Classification Search
CPC .... H01S 5/0265; H01S 5/0085; H01S 5/0428; H01S 5/06216; H01S 3/10084; H01S 3/2375; H01S 3/2308; G02F 1/0327
See application file for complete search history.

(56) References Cited

U.S. PATENT DOCUMENTS 4,669,086 A * 5/1987 Kaede ..................... H01S 3/137 372/32
4,972,352 A * 11/1990 O'Dowd ............... H01S 5/0625 372/108

(Continued)

FOREIGN PATENT DOCUMENTS

CN 205231456 U 5/2016
CN 107271368 A * 10/2017

(Continued)

OTHER PUBLICATIONS

International Search Report dated Feb. 27, 2018 in PCT/JP2017/044212 filed Dec. 8, 2017 (with English Translation).

(Continued)

*Primary Examiner* — Joshua King
(74) *Attorney, Agent, or Firm* — Oblon, McClelland, Maier & Neustadt, L.L.P.

(57) ABSTRACT

A pulsed laser device includes a laser light source, an electro-optic modulator, a laser light source driver, an electro-optic modulator driver, and a controller to control the laser light source driver and the electro-optic modulator driver. The laser light source outputs pulsed laser light pulse-modulated by the laser light source driver. The electro-optic modulator outputs pulsed laser light obtained by causing the electro-optic modulator driver to pulse-modulate the pulsed laser light from the laser light source. The control unit controls the laser light source driver and the electro-optic modulator driver such that the electro-optic modulator turns on at least while the laser light source is on and the electro-optic modulator turns on at least once while the laser light source is off, thereby increasing a duty ratio of the pulse modulation for the electro-optic modulator relative to a duty ratio of the pulse modulation for the laser light source.

20 Claims, 25 Drawing Sheets

(51) Int. Cl.
*H01S 5/026* (2006.01)
*H01S 5/062* (2006.01)
*H01S 5/042* (2006.01)
*H01S 5/00* (2006.01)

(52) U.S. Cl.
CPC .......... *H01S 5/0265* (2013.01); *H01S 5/0428* (2013.01); *H01S 5/062* (2013.01); *H01S 3/2375* (2013.01); *H01S 5/06216* (2013.01)

(56) References Cited

U.S. PATENT DOCUMENTS

| | | | | | |
|---|---|---|---|---|---|
| 5,128,950 | A * | 7/1992 | Tsuchiya | G01R 15/247 372/25 | |
| 5,325,225 | A * | 6/1994 | Suzaki | H04B 10/505 372/26 | |
| 5,394,260 | A * | 2/1995 | Suzuki | H04B 10/25077 398/185 | |
| 5,434,693 | A * | 7/1995 | Tanaka | H04B 10/50 398/192 | |
| 5,546,415 | A * | 8/1996 | Delfyett | H01S 5/50 372/18 | |
| 5,719,372 | A * | 2/1998 | Togari | B23K 26/0622 219/121.61 | |
| 6,304,353 | B1 * | 10/2001 | Gehlot | H04B 10/532 398/158 | |
| 6,339,604 | B1 * | 1/2002 | Smart | B23K 26/064 372/26 | |
| 6,535,315 | B1 * | 3/2003 | Way | H04B 10/2537 398/182 | |
| 6,631,145 | B1 * | 10/2003 | Tamura | H01S 5/06256 372/18 | |
| 6,807,378 | B1 * | 10/2004 | Pincemin | H04B 10/299 398/175 | |
| 7,502,394 | B2 * | 3/2009 | Hu | H01S 5/06256 372/26 | |
| 8,467,425 | B1 | 6/2013 | Zhang | | |
| 9,819,142 | B2 | 11/2017 | Fermann | | |
| 2004/0188399 | A1 * | 9/2004 | Smart | B23K 26/0624 219/121.69 | |
| 2005/0008048 | A1 * | 1/2005 | McInerney | H01S 5/065 372/25 | |
| 2005/0100062 | A1 * | 5/2005 | Grant | B23K 26/0853 372/10 | |
| 2007/0237193 | A1 * | 10/2007 | Finzi | H01S 5/0622 372/28 | |
| 2009/0242522 | A1 | 10/2009 | Baird et al. | | |
| 2009/0242531 | A1 * | 10/2009 | Baird | B23K 26/0622 219/121.81 | |
| 2010/0086314 | A1 | 4/2010 | Yu et al. | | |
| 2011/0150484 | A1 * | 6/2011 | Wang | H04B 10/505 398/115 | |
| 2011/0240619 | A1 | 10/2011 | Hayashi | | |
| 2011/0261439 | A1 * | 10/2011 | Klehr | H01S 5/0265 359/341.1 | |
| 2011/0267671 | A1 * | 11/2011 | Peng | H01S 3/115 359/257 | |
| 2016/0254646 | A1 | 9/2016 | Li et al. | | |
| 2016/0359290 | A1 * | 12/2016 | Inaba | G03F 7/70041 | |
| 2017/0155225 | A1 * | 6/2017 | Villeneuve | G01S 17/06 | |

FOREIGN PATENT DOCUMENTS

| | | | | |
|---|---|---|---|---|
| CN | 110915079 | A * | 3/2020 | H01S 3/06758 |
| DE | 102014017568 | A1 * | 6/2016 | H01S 3/2308 |
| DE | 102016107068 | A1 * | 10/2017 | G02F 1/0327 |
| EP | 2457337 | B1 * | 11/2020 | B23K 26/0622 |
| JP | 55-77187 | A | 6/1980 | |
| JP | 9-230292 | A | 9/1997 | |
| JP | 10-233544 | A | 9/1998 | |
| JP | 11-77343 | | 3/1999 | |
| JP | 2002-118315 | | 4/2002 | |
| JP | 4232130 | B2 | 3/2009 | |
| JP | 2010-167491 | | 8/2010 | |
| JP | 2011-519312 | | 7/2011 | |

OTHER PUBLICATIONS

Written Opinion dated Feb. 27, 2018 in PCT/JP2017/044212 filed Dec. 8, 2017.

Combined Chinese Office Action and Search Report dated Jun. 3, 2020 in Chinese Patent Application No. 201780075920.1 (with English translation of Cover Page and unedited computer generated English translation of body of Office Action), 10 pages.

German Office Acton dated Jul. 17, 2020 in German Patent Application No. 112017006203.9 (with English translation), 10 pages.

* cited by examiner

PULSED LASER DEVICE, PROCESSING DEVICE, AND METHOD OF CONTROLLING PULSED LASER DEVICE

CROSS-REFERENCE TO RELATED APPLICATION(S)

This application is a continuation of PCT International Application No. PCT/JP2017/044212, filed on Dec. 8, 2017 which claims the benefit of priority from Japanese Patent Application No. 2016-238985, filed on Dec. 9, 2016, the entire contents of which are incorporated herein by reference.

BACKGROUND

The present disclosure relates to a pulsed laser device, a processing device, and a method of controlling the pulsed laser device.

In the related art, pulsed laser devices of, so called, Master Oscillator Power Amplifier (MOPA) type that output high power pulsed laser light by amplifying pulsed laser light as seed light, which is output from a pulsed laser device as a seed light source, with an optical amplifier, such as an optical fiber amplifier, have been disclosed (see Japanese Laid-open Patent Publication No. 2002-118315) This type of pulsed laser device is used for laser processing or the like.

A pulsed laser device of MOPA type is capable of changing a pulse width of pulsed laser light output from a pulsed laser device in accordance with usage or a material of laser processing by changing a pulse width of seed light, thereby optimizing the processing. In particular, a method of extracting and outputting a part of pulsed light by an intensity modulation type Electro-Optic Modulator (EOM) has been known as a technique of obtaining a pulse width of 1 ns or smaller (Japanese Patent No. 4232130). The EOM is a modulator that is also used for optical communication and is capable of responding at high speed of 10 GHz or higher, thereby making it possible to realize a pulse width of 1 ns or smaller.

SUMMARY

The pulsed laser device may be used under conditions of a "low repetition frequency" and a "short pulse width". These conditions are, for example, conditions of a repetition frequency of 10 kHz and a pulse width of 100 ps. In this case, a duty ratio of the pulsed laser light becomes 0.0001%, which is an extremely low value.

In order to drive the EOM, a driving circuit, such as a radio frequency (RF) amplifier, is needed. Here, a most part of the driving circuit of the EOM is mainly used for communication applications, and therefore, in some cases, the driving circuit may be configured to operate optimally under a driving condition that a ratio of a HIGH state (or an ON state) and a LOW state (or an OFF state) are approximately equal to each other, that is, a duty ratio is about 50%. The driving circuit as described above has such a characteristic that the amplitude of an output voltage becomes maximum when, for example, the duty ratio is 50%, and the amplitude of the output voltage is reduced as the duty ratio deviates from 50%.

Under the condition that the duty ratio is extremely low as in the example as described above, the driving circuit is unable to output, to the EOM, a voltage with an amplitude that is needed to appropriately drive the EOM, so that ON/OFF extinction ratios of the EOM and pulsed laser light that is extracted by the EOM may be reduced. In contrast, it is necessary to ensure high output power to construct a driving circuit that is able to output a voltage with a necessary amplitude to the EOM even under the condition that the duty ratio is extremely low, which causes a problem with an increase in the size of the driving circuit.

The present disclosure has been conceived in view of the foregoing, and an object thereof is to provide a pulsed laser device, a processing device, and a method of controlling the pulsed laser device capable of outputting pulsed laser light with a low duty ratio in a preferred state.

According to a first aspect of the present disclosure, a pulsed laser device is provided which includes a laser light source; an electro-optic modulator; a laser light source driving unit that drives the laser light source by pulse modulation; an electro-optic modulator driving unit that drives the electro-optic modulator by pulse modulation; and a control unit that controls the laser light source driving unit and the electro-optic modulator driving unit, wherein the laser light source is pulse-operated by the laser light source driving unit thereby to output pulsed laser light, the electro-optic modulator outputs pulsed laser light that is obtained by causing the electro-optic modulator driving unit to pulse-modulate the pulsed laser light that is output by the laser light source, and the control unit controls the laser light source driving unit and the electro-optic modulator driving unit so as to realize pulse modulation for the laser light source and pulse modulation for the electro-optic modulator such that the electro-optic modulator transitions to an ON state at least while the laser light source is in an ON state and such that the electro-optic modulator transitions to the ON state at least once while the laser light source is in an OFF state, to thereby increase a duty ratio of the pulse modulation for the electro-optic modulator relative to a duty ratio of the pulse modulation for the laser light source.

According to a second aspect of the present disclosure, a pulsed laser device is provided which includes a laser light source; a semiconductor optical amplifier; an electro-optic modulator; a laser light source driving unit that drives the laser light source; a semiconductor optical amplifier driving unit that drives the semiconductor optical amplifier by pulse modulation; an electro-optic modulator driving unit that drives the electro-optic modulator by pulse modulation; and a control unit that controls the laser light source driving unit, the semiconductor optical amplifier driving unit, and the electro-optic modulator driving unit, wherein the laser light source outputs laser light, the semiconductor optical amplifier outputs pulsed laser light that is obtained by causing the semiconductor optical amplifier driving unit to perform pulse modulation on the laser light, the electro-optic modulator outputs pulsed laser light that is obtained by causing the electro-optic modulator driving unit to pulse-modulate the pulsed laser light that is output by the semiconductor optical amplifier, and the control unit controls the semiconductor optical amplifier driving unit and the electro-optic modulator driving unit so as to realize pulse modulation for the semiconductor optical amplifier and pulse modulation for the electro-optic modulator such that the electro-optic modulator transitions to an ON state at least while the semiconductor optical amplifier is in an ON state and such that the electro-optic modulator transitions to the ON state at least once while the semiconductor optical amplifier is in an OFF state, to thereby increase a duty ratio of the pulse modulation for the electro-optic modulator relative to a duty ratio of the pulse modulation for the semiconductor optical amplifier.

According to a third aspect of the present disclosure, a pulsed laser device is provided which includes a laser light source; an acousto-optic modulator; an electro-optic modulator; a laser light source driving unit that drives the laser light source; an acousto-optic modulator driving unit that drives the acousto-optic modulator by pulse modulation; an electro-optic modulator driving unit that drives the electro-optic modulator by pulse modulation; and a control unit that controls the laser light source driving unit, the acousto-optic modulator driving unit, and the electro-optic modulator driving unit, wherein the laser light source outputs laser light, the acousto-optic modulator outputs pulsed laser light that is obtained by causing the acousto-optic modulator driving unit to perform pulse modulation on the laser light, the electro-optic modulator outputs pulsed laser light that is obtained by causing the electro-optic modulator driving unit to pulse-modulate the pulsed laser light that is output by the acousto-optic modulator, and the control unit controls the acousto-optic modulator driving unit and the electro-optic modulator driving unit so as to realize pulse modulation for the acousto-optic modulator and pulse modulation for the electro-optic modulator such that the electro-optic modulator transitions to an ON state at least while the acousto-optic modulator is in an ON state and such that the electro-optic modulator transitions to the ON state at least once while the acousto-optic modulator is in an OFF state, to thereby increase a duty ratio of the pulse modulation for the electro-optic modulator relative to a duty ratio of the pulse modulation for the acousto-optic modulator.

According to a fourth aspect of the present disclosure, a processing device is provided which includes the pulsed laser device according to any one of the first to the third aspects claims 1 to 30; and a processing head that applies pulsed laser light output from the pulsed laser device to a processing target.

According to a fifth aspect of the present disclosure, there is provided a method of controlling a pulsed laser device that includes a laser light source and an electro-optic modulator, wherein the laser light source outputs pulsed laser light pulse-modulated and the electro-optic modulator outputs pulsed laser light that is obtained by further pulse-modulating the pulsed laser light that is output from the laser light source. The method includes realizing pulse modulation for the laser light source and pulse modulation for the electro-optic modulator such that the electro-optic modulator transitions to an ON state at least while the laser light source is in the ON state; causing the electro-optic modulator to transition to the ON state at least once while the laser light source is in an OFF state; and increasing a duty ratio of the pulse modulation for the electro-optic modulator relative to a duty ratio of the pulse modulation for the laser light source.

According to a sixth aspect of the present disclosure, there is provided a method of controlling a pulsed laser device that includes a laser light source, a semiconductor optical amplifier, and an electro-optic modulator, wherein the laser light source outputs laser light, the semiconductor optical amplifier outputs pulsed laser light that is obtained by performing pulse modulation on the laser light output from the laser light source, and the electro-optic modulator outputs pulsed laser light that is obtained by performing pulse modulation on the pulsed laser light output from the semiconductor optical amplifier. The method includes realizing pulse modulation for the semiconductor optical amplifier and pulse modulation for the electro-optic modulator such that the electro-optic modulator transitions to an ON state at least while the semiconductor optical amplifier is in an ON state; causing the electro-optic modulator to transition to the ON state at least once while the semiconductor optical amplifier is in an OFF state; and increasing a duty ratio of the pulse modulation for the electro-optic modulator relative to a duty ratio of the pulse modulation for the semiconductor optical amplifier.

According to a seventh aspect of the present disclosure, there is provided a method of controlling a pulsed laser device that includes a laser light source, an acousto-optic modulator, and an electro-optic modulator, wherein the laser light source outputs laser light, the acousto-optic modulator outputs pulsed laser light that is obtained by performing pulse modulation on the laser light output from the laser light source, and the electro-optic modulator outputs pulsed laser light that is obtained by performing pulse modulation on the pulsed laser light output from the acousto-optic modulator. The method includes realizing pulse modulation for the acousto-optic modulator and pulse modulation for the electro-optic modulator such that the electro-optic modulator transitions to an ON state at least while the acousto-optic modulator is in an ON state; causing the electro-optic modulator to transition to the ON state at least once while the acousto-optic modulator is in an OFF state; and increasing a duty ratio of the pulse modulation for the electro-optic modulator relative to a duty ratio of the pulse modulation for the acousto-optic modulator.

DETAILED DESCRIPTION

Embodiments of the present disclosure will be described in detail below with reference to the drawings. The present disclosure is not limited by the embodiments below. Further, in each of the drawings, the same or corresponding elements are appropriately denoted by the same reference signs, and the same explanation will be omitted.

First Embodiment

Figure 1:
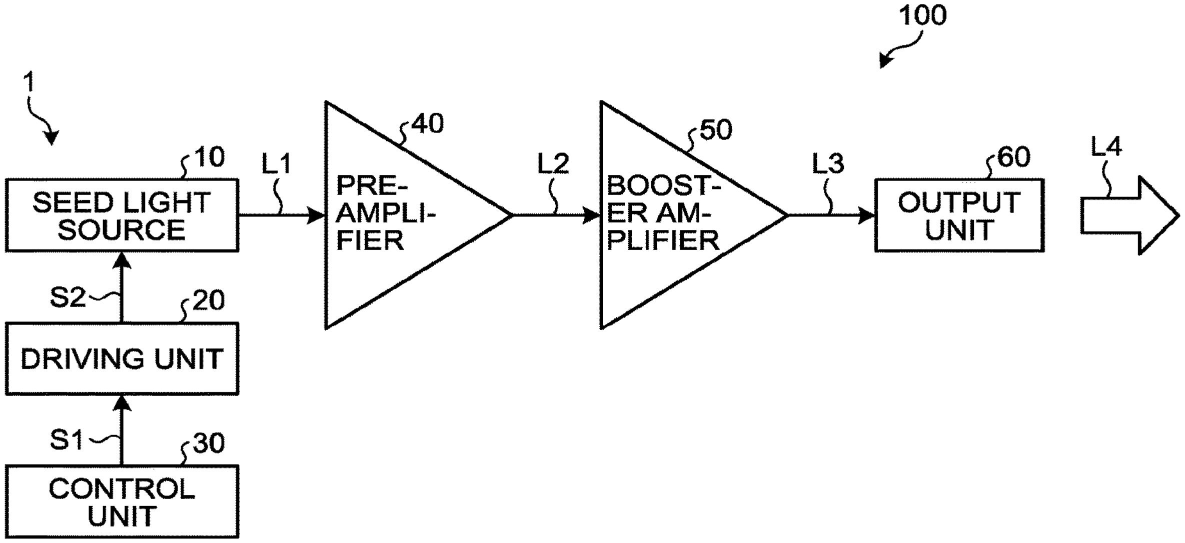
FIG. 1 is a block diagram of a pulsed laser device according to a first embodiment.

FIG. 1 is a block diagram of a pulsed laser device according to a first embodiment. A pulsed laser device 100 includes a seed light source 10, a driving unit 20, a control unit 30, a preamplifier 40, a booster amplifier 50, and an output unit 60. The seed light source 10, the preamplifier 40, and the booster amplifier 50 are connected to one another by a single mode optical fiber.

The seed light source 10 outputs, as seed light, laser light L1 that is pulsed laser light. The preamplifier 40 is an optical amplifier, such as an optical fiber amplifier, receives the laser light L1 and optically amplifies the received laser light L1, and outputs the amplified laser light L1 as laser light L2 to the booster amplifier 50. The booster amplifier 50 is an optical amplifier, such as an optical fiber amplifier, that normally has higher output power than the preamplifier 40, receives the laser light L2 and optically amplifies the received laser light L2, and outputs the amplified laser light L2 as laser light L3 to the output unit 60. The output unit 60 is configured with a known laser head, receives the laser light L3 via the optical fiber, and outputs the received laser light L3 as laser light L4 to the outside. The laser light L4 is used for a desired purpose (laser processing or the like).

Further, at least the seed light source 10, the driving unit 20, and the control unit 30 constitute a seed light source device 1 that is a pulsed laser device. The control unit 30 outputs a control signal S1 to the driving unit 20 and controls the driving unit 20. The driving unit 20 outputs a driving signal S2 to the seed light source 10 and drives the seed light source 10.

Figure 2:
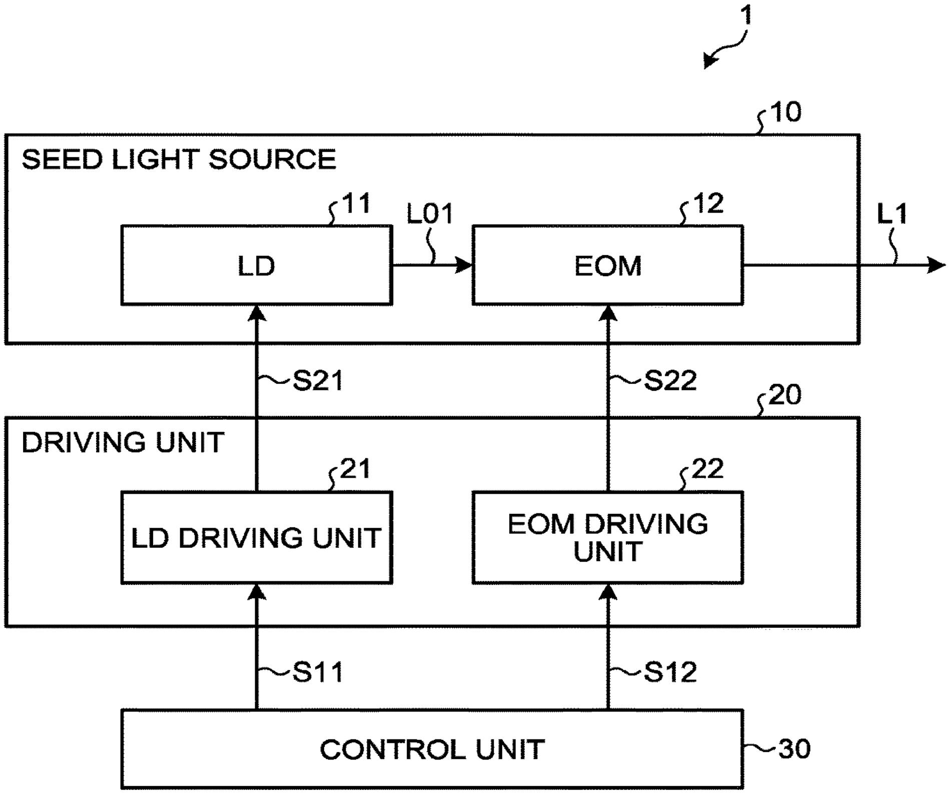
FIG. 2 is a block diagram of a seed light source device illustrated in FIG. 1.

FIG. 2 is a block diagram of the seed light source device 1. The seed light source 10 includes a semiconductor laser diode (LD) 11 as a laser light source and an electro-optic modulator (EOM) 12. The driving unit 20 includes an LD driving unit 21 as a laser light source driving unit and an EOM driving unit 22 as an electro-optic modulator driving unit. These driving units can be configured using a known LD driving circuit or the like.

The control unit 30 is configured with a digital circuit including a central processing unit (CPU), a field programmable gate array (FPGA), or the like for performing a control process on each of the driving units included in the driving unit 20. The control unit 30 outputs an LD driving pulse signal S11 that is a part of the control signal S1 to the LD driving unit 21, and outputs an EOM driving pulse signal S12 that is a part of the control signal S1 to the EOM driving unit 22. Each of the LD driving pulse signal S11 and the EOM driving pulse signal S12 is a pulse signal that is in an ON state in a predetermined repetition period and with a certain duration (pulse width) and is in an OFF state in other periods.

The LD 11 is, for example, a Distributed Feedback (DFB) laser element that outputs laser light L01 of a single wavelength included in a 1.55-μm wavelength band. The LD driving unit 21 outputs an LD driving signal S21 as a signal that is a part of the driving signal S2 and corresponds to the LD driving pulse signal S11 to the LD 11, and drives the LD 11 by pulse modulation (or in a pulse mode). Therefore, the laser light L01 becomes pulsed laser light that is pulse-modulated. The EOM 12 receives the laser light L01 output from the LD 11, performs intensity modulation on the laser light L01, and outputs the modulated laser light L01 as the laser light L1. The EOM driving unit 22 outputs an EOM driving signal S22 as a signal that is a part of the driving signal S2 and corresponds to the EOM driving pulse signal S12 to the EOM 12, and drives the EOM 12 by pulse modulation. Therefore, the laser light L1 becomes pulsed laser light that is obtained by performing pulse modulation on the laser light L01.

Here, in the seed light source device 1, the control unit 30 performs a control method of controlling the LD driving unit 21 and the EOM driving unit 22 so as to realize pulse modulation for the LD 11 and pulse modulation for the EOM 12 such that the EOM 12 transitions to the ON state at least while the LD 11 is in the ON state and such that the EOM 12 transitions to the ON state at least once while the LD 11 is in the OFF state.

Figure 3:
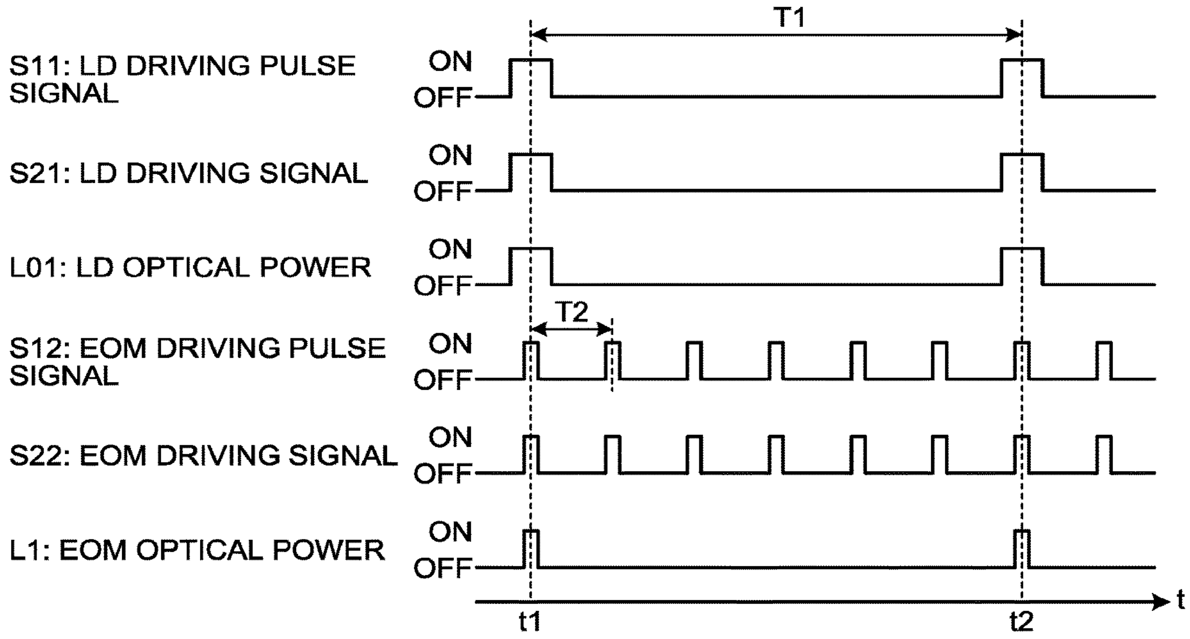
FIG. 3 is a diagram illustrating a first example of time charts of signals and optical output in the seed light source device illustrated in FIG. 1.

Details will be described below. FIG. 3 is a diagram illustrating a first example of time charts of signals and optical output in the seed light source device 1.

As illustrated in FIG. 3, the LD driving pulse signal S11 that is output by the control unit 30 to the LD driving unit 21 is a pulse signal that is in the ON state with a constant pulse width centered at times t1 and t2 and is in the OFF state in other periods in a time range illustrated in the figure. The LD driving pulse signal S11 has a repetition period T1 and a repetition frequency f1=1/T1, which is constant. The LD driving signal S21 is a signal that is synchronized with the LD driving pulse signal S11. Therefore, the laser light L01 (LD optical output) output from the LD 11 also becomes pulsed laser light formed of an optical pulse train that is synchronized with the LD driving pulse signal S11 and the LD driving signal S21.

In contrast, the EOM driving pulse signal S12 that is output by the control unit 30 to the EOM driving unit 22 is a pulse signal that is in the ON state with a constant pulse width and is in the OFF state in other periods, and a repetition period thereof is T2 that is smaller than T1. Therefore, a repetition frequency of the EOM driving pulse signal S12 is f2=1/T2, which is constant, where f2 is larger than f1 and f2=6×f1 in the example illustrated in FIG. 3. Meanwhile, the EOM driving signal S22 is a signal that is synchronized with the EOM driving pulse signal S12.

In this manner, in the first example, the repetition frequency f2 of the EOM driving pulse signal S12 is set to be constant and f2 is set to be six times larger than the repetition frequency f1 of the LD driving pulse signal S11, so that the EOM 12 transitions to the ON state five times while the LD 11 is in the OFF state.

Further, timings of the LD driving signal S21 and the EOM driving signal S22 are adjusted such that the EOM 12 transitions to the ON state at least while the LD 11 is in the ON state. Specifically, the EOM 12 transitions to the ON state while the LD 11 is in the ON state centered at the times t1 and t2. Therefore, the laser light L1 (EOM optical output) output from the EOM 12 becomes pulsed laser light that is formed of an optical pulse train with the repetition frequency f1 and the same pulse width as the pulse width of the EOM driving signal S22. Meanwhile, in the first example illustrated in FIG. 3, the pulse width of the EOM driving signal S22 while the LD 11 is in the ON state is smaller than the pulse width of the LD driving signal S21. Therefore, the laser light L1 is pulsed laser light that is extracted from the laser light L01 by the EOM 12 in accordance with the pulse width of the EOM driving signal S22. The repetition frequency f1 of the LD driving pulse signal S11 and the pulse width of the EOM driving pulse signal S12 are set to desired values with respect to the laser light L1 through settings made by a user, or the like.

In this manner, by increasing the repetition frequency f2 of the pulse modulation for the EOM 12 relative to the repetition frequency f1 of the pulse modulation for the LD 11, it is possible to increase a duty ratio of the pulse modulation for the EOM 12 relative to a duty ratio of the pulse modulation for the LD 11 during the repetition period T1 of the pulse modulation for the LD 11. Here, the duty ratio of the pulse modulation for the EOM 12 is represented by (a time in which the EOM 12 is in the ON state during the repetition period T1)/(the repetition period T1). Further, the duty ratio of the pulse modulation for the LD 11 is similarly represented by (a time in which the LD 11 is in the ON state during the repetition period T1)/(the repetition period T1).

Figure 4:
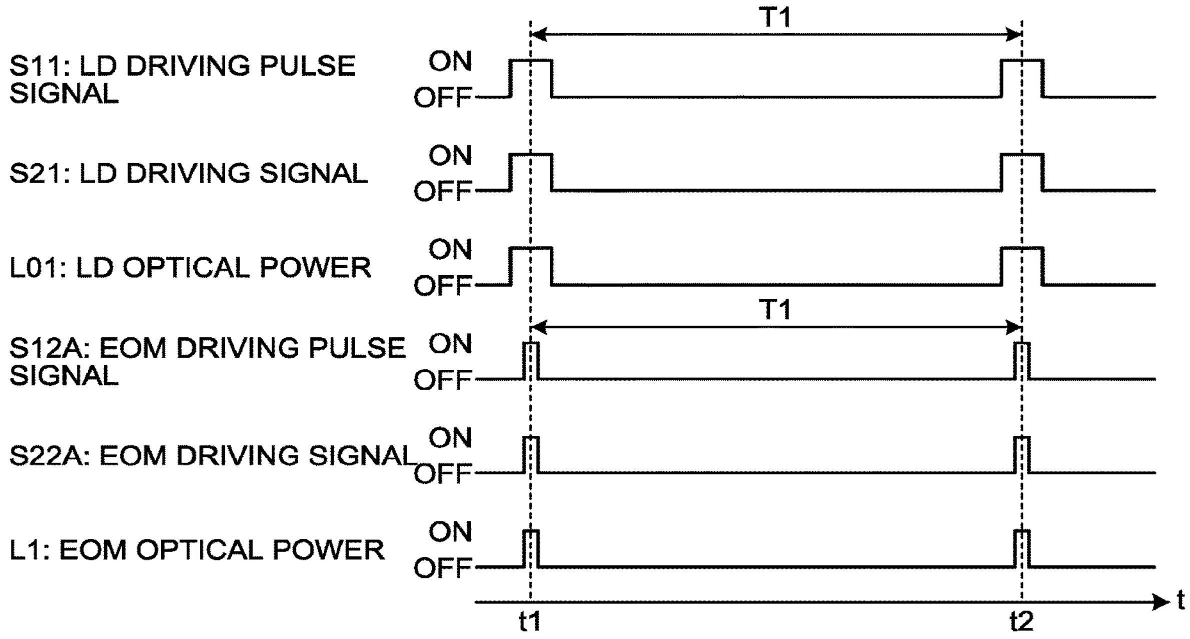
FIG. 4 is a diagram illustrating an example of time charts of signals and optical output according to a comparative example.

The reason for this will be described in detail with reference to FIG. 3, FIG. 4, and FIG. 5. FIG. 4 is a diagram illustrating an example of time charts of signals and optical output according to a comparative example. In the comparative example, in the seed light source device 1, the control unit 30 performs control such that the repetition frequency of the pulse modulation for the EOM 12 and the repetition frequency of the pulse modulation for the LD 11 are equalized and the EOM 12 transitions to the ON state only when the LD 11 is in the ON state. In other words, in the comparative example, repetition periods of an EOM driving pulse signal S12A and an EOM driving signal S22A and the repetition periods of the LD driving pulse signal S11 and the LD driving signal S21 are set to the same T1, and repetition frequencies thereof are set to the same as f1=1/T1. Consequently, the repetition frequency of the laser light L1 is set to the desired frequency f1.

By comparison between the EOM driving signal S22 in FIG. 3 and the EOM driving signal S22A in FIG. 4, it can be found that the duty ratio of the EOM driving signal S22 is higher. In contrast, in FIG. 3 and FIG. 4, the repetition frequency of the laser light L1 is set to f1 in each case.

In other words, in the seed light source device 1, the control unit 30 performs control so as to realize the time charts as illustrated in FIG. 3, so that it is possible to set the repetition frequency of the laser light L1 to the desired frequency f1 and increase the duty ratio of the EOM driving signal S22 relative to the comparative example so as to approach, for example, 50%.

Figure 5:
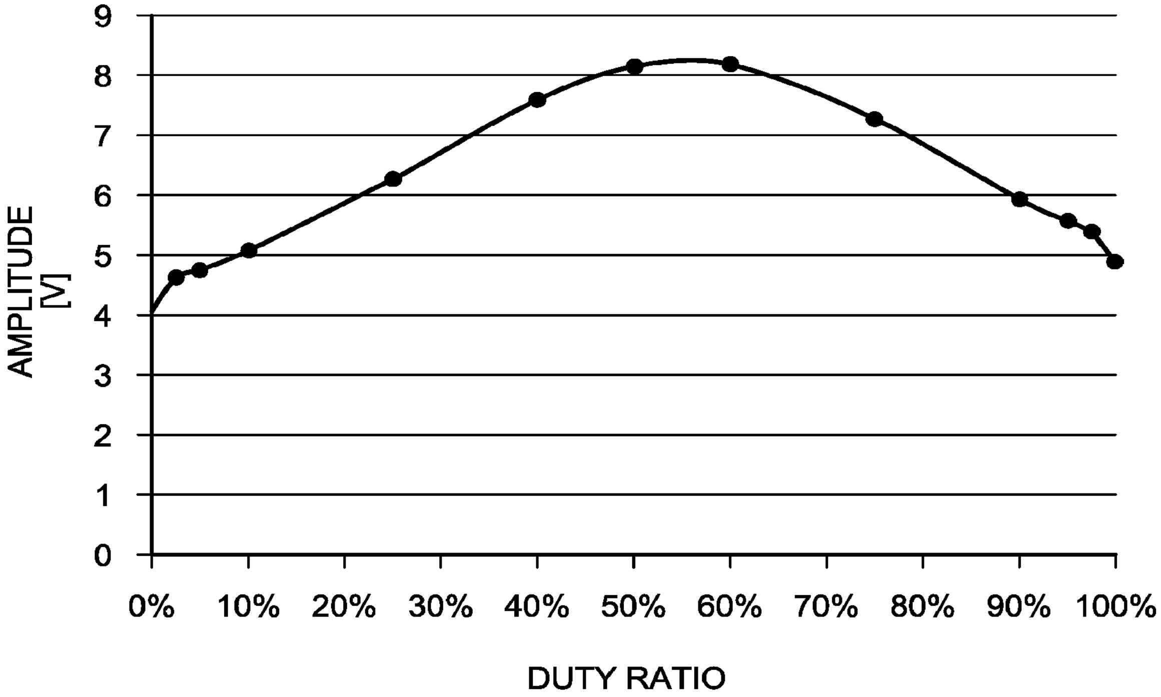
FIG. 5 is a diagram illustrating output characteristics of a typical EOM driving unit.

Meanwhile, FIG. 5 is a diagram illustrating output characteristics of a typical EOM driving unit. The horizontal axis represents a duty ratio of an EOM driving pulse signal, and the vertical axis represents an amplitude of an output voltage of the EOM driving unit. Meanwhile, a voltage amplitude of the EOM driving pulse signal input to the EOM driving unit is set to be constant for all of the duty ratios. As illustrated in FIG. 5, the amplitude of the output voltage becomes maximum when the duty ratio is about 50%, and is reduced as the duty ratio deviates from 50%. This is because, in a typical EOM driving circuit, an input signal is subjected to Alternate Current (AC) coupling and then amplified. When the duty ratio is 50%, voltages with the same absolute values in positive and negative directions with respect to 0 V are obtained after AC coupling, but when the duty ratio deviates from 50%, voltages with different absolute values in the positive and negative directions with respect to 0 V are obtained after AC coupling. If this signal is amplified, the voltage with the larger absolute value in the positive or negative direction first reaches a maximum output voltage of the EOM driving unit, and as a result, the voltage amplitude to be output is limited.

Figure 6A:
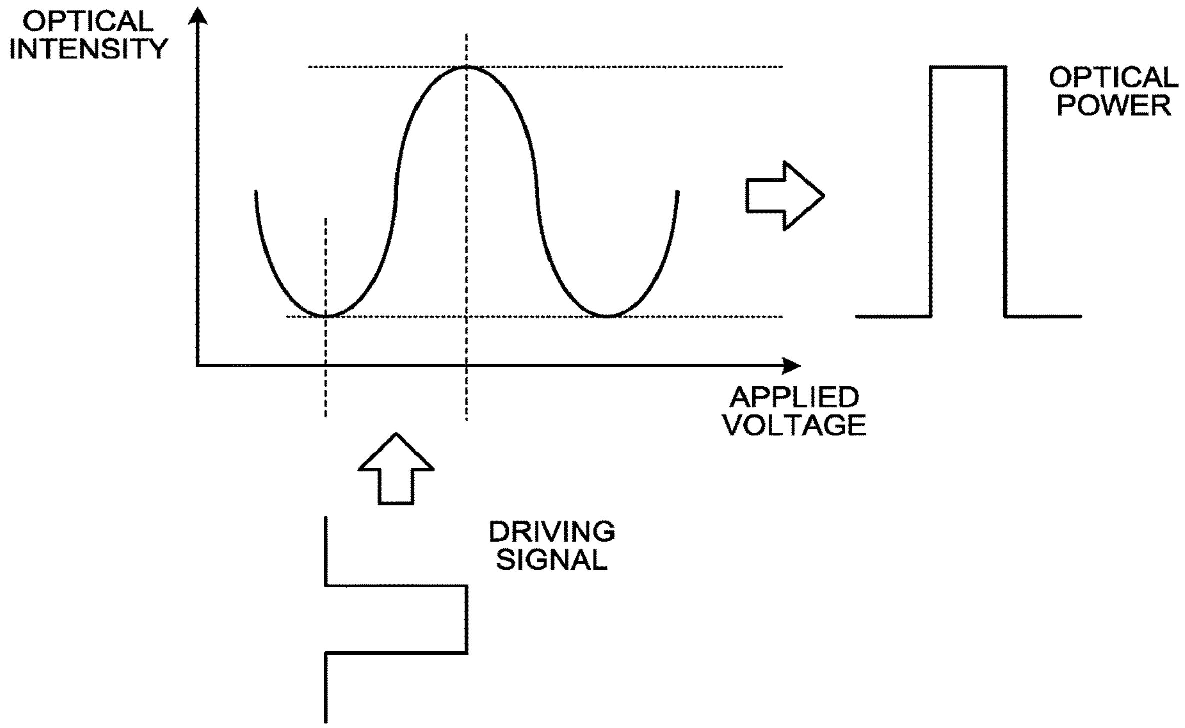
FIG. 6A is a diagram for explaining a relationship between an EOM driving signal and EOM optical output.
Figure 6B:
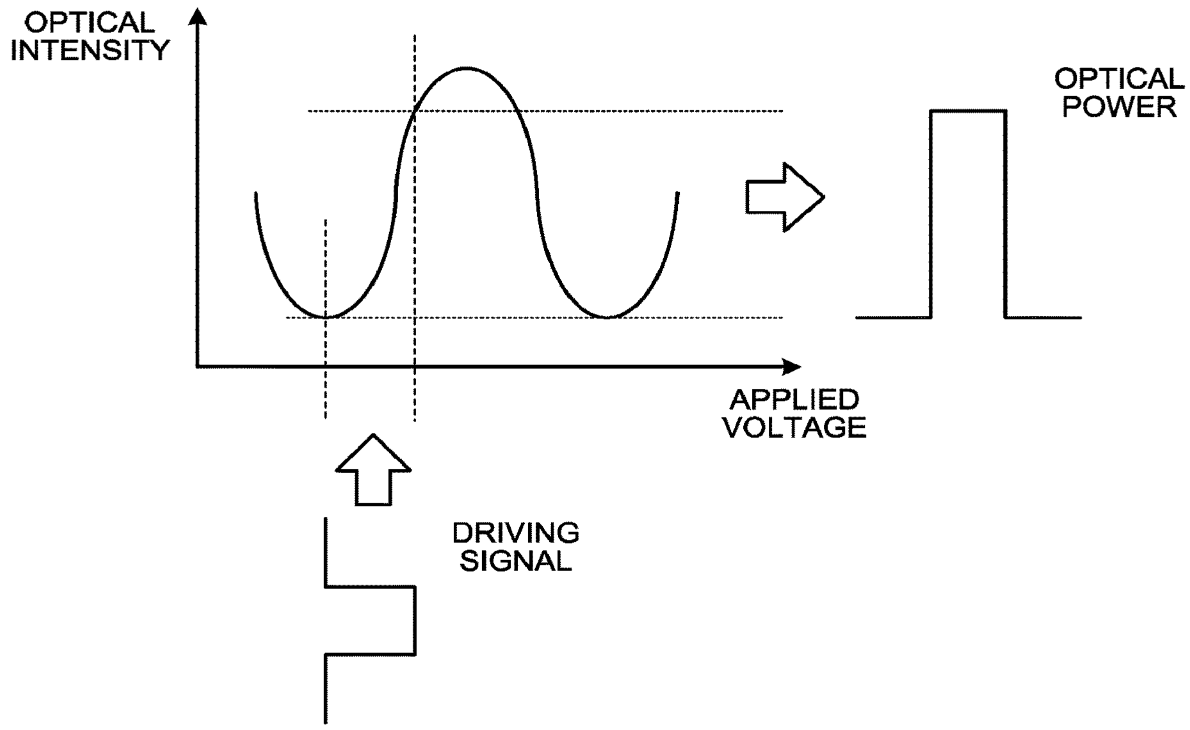
FIG. 6B is a diagram for explaining the relationship between the EOM driving signal and the EOM optical output.

Further, FIGS. 6A and 6B are diagrams for explaining a relationship between the EOM driving signal and the EOM optical output. If a voltage applied to the EOM by the EOM driving signal can be optimized as illustrated in FIG. 6A, it is possible to maximize an ON/OFF extinction ratio of the EOM optical output. Meanwhile, a value of the optimal voltage to be applied to the EOM depends on the EOM. However, under a driving condition that the duty ratio is low, the voltage amplitude of the EOM driving signal is reduced as illustrated in FIG. 6B and it becomes difficult to apply the optimal voltage to the EOM, so that the ON/OFF extinction ratio of the EOM optical output is reduced. In particular, under a condition that the duty ratio is extremely low, such as a "low repetition frequency" and a "short pulse", the ON/OFF extinction ratio of the EOM optical output is remarkably reduced.

In contrast, in the seed light source device 1, even when the laser light L1 with a low duty ratio is output, it is possible to drive the EOM 12 with the increased duty ratio, so that it is possible to output power with the preferred ON/OFF extinction ratio.

Meanwhile, assuming that N is an integer equal to or larger than 2, it is possible to control the LD driving signal S21 and the EOM driving signal S22 such that the EOM 12 transitions to the ON state at least while the LD 11 is in the ON state when the repetition frequency f2 of the EOM driving signal S22 is N times larger than the repetition frequency f1 of the LD driving signal S21. It is more preferable to set N to a value by which the duty ratio of the EOM driving signal S22 during the repetition period T1 of the pulse modulation for the LD 11 reaches approximately 50%.

Meanwhile, the control method performed by the control unit 30 for making it possible to drive the EOM 12 with the improved duty ratio by causing the EOM 12 to transition to the ON state at least while the LD 11 is in the ON state and causing the EOM 12 to transition to the ON state at least once while the LD 11 is in the OFF state is not limited to the control as indicated by the time charts of the first example illustrated in FIG. 3.

Figure 7A:
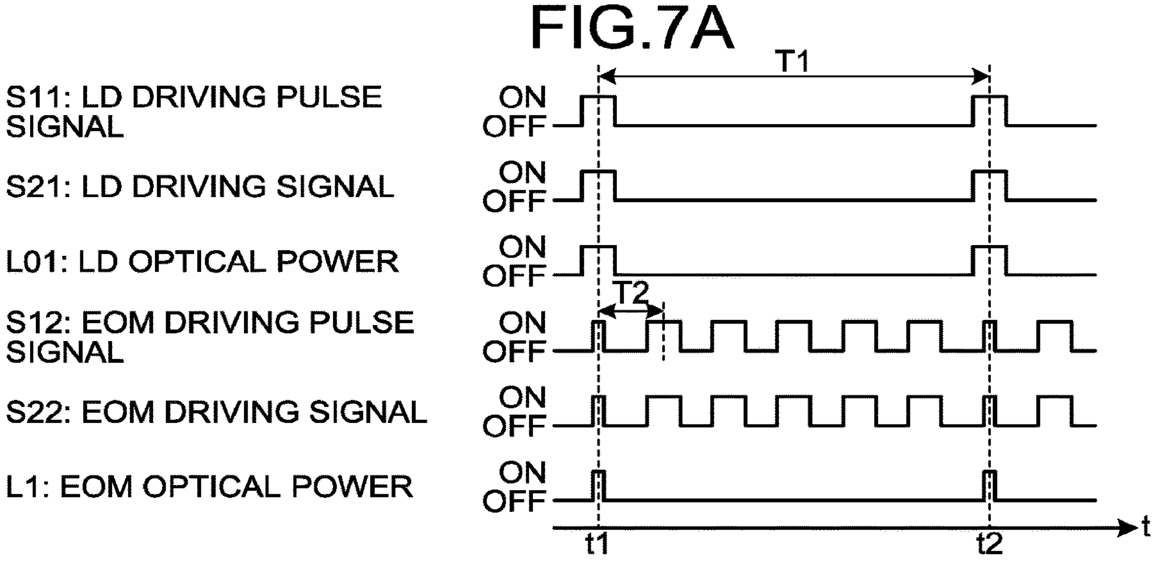
FIG. 7A is a diagram illustrating a second example of the time charts of the signals and the optical output in the seed light source device illustrated in FIG. 1.
Figure 7B:
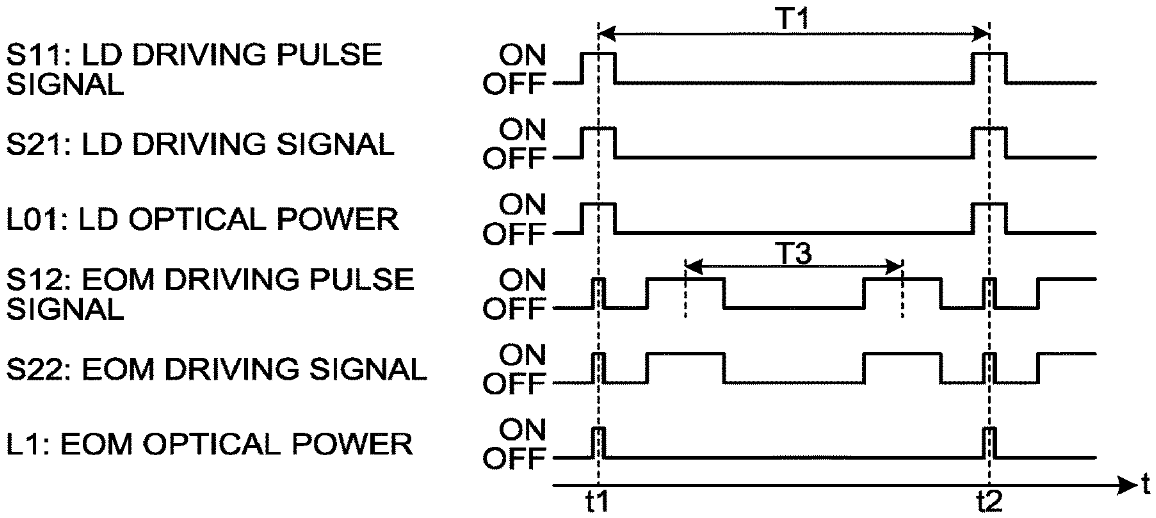
FIG. 7B is a diagram illustrating a third example of the time charts of the signals and the optical output in the seed light source device illustrated in FIG. 1.
Figure 7C:
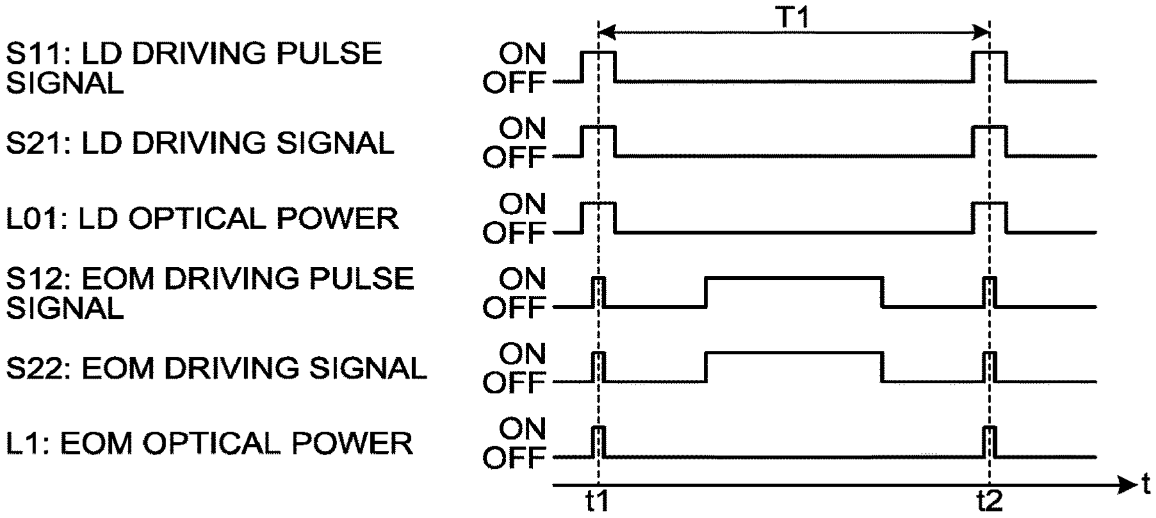
FIG. 7C is a diagram illustrating a fourth example of the time charts of the signals and the optical output in the seed light source device illustrated in FIG. 1.

FIGS. 7A, 7B, and 7C are diagrams illustrating a second example, a third example, and a fourth example of the time charts of the signals and the optical output in the seed light source device 1. In the second example illustrated in FIG. 7A, similarly to the first example, the repetition frequency of the EOM driving pulse signal S12 is set as f2=1/T2. However, the pulse width of the EOM driving pulse signal S12 during a period in which the LD driving pulse signal S11 is in the OFF state is larger than the pulse width of the EOM driving pulse signal S12 during a period in which the LD driving pulse signal S11 is in the ON state. Therefore, it is possible to realize the laser light L1 as pulsed laser light that is extracted from the laser light L01 by the EOM 12 in accordance with the pulse width of the EOM driving signal S22, and it is possible to drive the EOM 12 with the improved duty ratio, such as a ratio close to about 50% or a ratio of about 50%.

Further, in the third example illustrated in FIG. 7B, the pulse width of the EOM driving pulse signal S12 during the period in which the LD driving pulse signal S11 is in the OFF state is larger than the pulse width of the EOM driving pulse signal S12 during the period in which the LD driving pulse signal S11 is in the ON state. Furthermore, a repetition period T3 of the EOM driving pulse signal S12 during the period in which the LD driving pulse signal S11 is in the OFF state is larger than T2 in the second example illustrated in FIG. 7A. In other words, the EOM driving pulse signal S12 in the third example is a combination of two pulse-modulated signals with different pulse widths and different repetition periods. Therefore, it is possible to realize the laser light L1 as pulsed laser light that is extracted from the laser light L01 by the EOM 12 in accordance with the pulse width of the EOM driving signal S22, and it is possible to drive the EOM 12 with the improved duty ratio, such as a ratio close to about 50% or a ratio of about 50%.

Moreover, in the fourth example illustrated in FIG. 7C, the pulse width of the EOM driving pulse signal S12 during the period in which the LD driving pulse signal S11 is in the OFF state is larger than the pulse width of the EOM driving pulse signal S12 during the period in which the LD driving pulse signal S11 is in the ON state, and the EOM driving pulse signal S12 transitions to the ON state only once while the LD driving pulse signal S11 is in the OFF state. Similarly to the third example, the EOM driving pulse signal S12 is a combination of two pulse-modulated signals with different pulse widths and different repetition periods. Therefore, it is possible to realize the laser light L1 as pulsed laser light that is extracted from the laser light L01 by the EOM 12 in accordance with the pulse width of the EOM driving signal S22, and it is possible to drive the EOM 12 with the improved duty ratio, such as a ratio close to about 50% or a ratio of about 50%.

As illustrated in the first example to the fourth example as described above, the pulse width and the repetition period of the EOM driving pulse signal S12 during the period in which the LD driving pulse signal S11 is in the OFF state are not specifically limited. For example, as in the fourth example, it may be possible to use a pulse signal that transitions to the ON state only once while the LD driving pulse signal S11 is in the OFF state, or a pulse signal with an irregular pulse width or an irregular repetition frequency.

Second Embodiment

Figure 8:
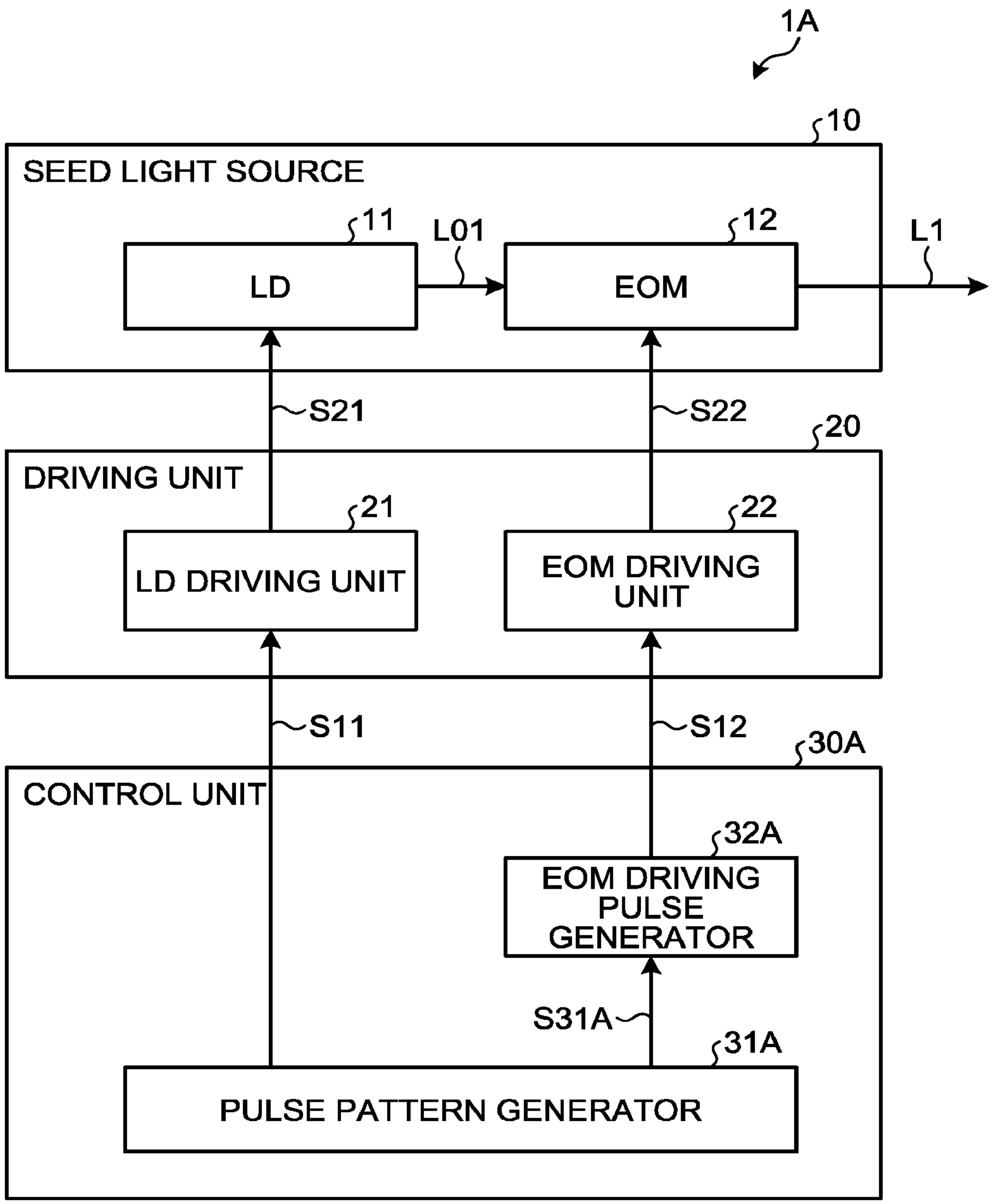
FIG. 8 is a block diagram of a seed light source device according to a second embodiment.

FIG. 8 is a block diagram of a seed light source device as a pulsed laser device according to a second embodiment. A seed light source device 1A has a configuration obtained by replacing the control unit 30 in the configuration of the seed light source device 1 illustrated in FIG. 1 with a control unit 30A.

The control unit 30A includes a pulse pattern generator 31A that is configured with a digital circuit including a general-purpose CPU, an FPGA, or the like, and an EOM driving pulse generator 32A configured with an analog circuit.

The pulse pattern generator 31A outputs the LD driving pulse signal S11, as a pulse pattern signal to be used to perform pulse modulation in the LD 11, to the LD driving unit 21. Further, the pulse pattern generator 31A outputs an EOM driving pulse pattern signal S31A, as a pulse pattern signal to be used to perform pulse modulation in the EOM 12, to the EOM driving pulse generator 32A.

The EOM driving pulse generator 32A generates the EOM driving pulse signal S12 with a smaller pulse width than the EOM driving pulse pattern signal S31A on the basis of the EOM driving pulse pattern signal S31A, and outputs the EOM driving pulse signal S12 to the EOM driving unit 22.

Here, in the seed light source device 1A, similarly to the seed light source device 1, by reducing the pulse width of the EOM driving signal S22 relative to the pulse width of the LD driving signal S21, the laser light L1 output from the EOM 12 becomes pulsed laser light that is extracted from the laser light L01, which is output from the LD 11, in accordance with the pulse width of the EOM driving signal S22. For example, even when the pulse width of the LD driving signal S21 is 1 ns, by setting the pulse width of the EOM driving signal S22 to 100 ps, it is possible to set the pulse width of the laser light L01 to 100 ps. Further, the control unit 30A includes a CPU, an FPGA, or the like, and is able to make the repetition frequency of the laser light L1 changeable in a preferred manner.

However, in a general-purpose digital circuit, an upper limit of a driving frequency of an output signal is about 1 GHz, and in some cases, it is difficult to generate a shorter pulse signal than 1 ns. Alternatively, while an FPGA equipped with a transceiver capable of generating a pulse signal at 10 Gbps or higher has been proposed, such an FPGA is extremely expensive and serves as a device that is specialized for communication applications, so that it is difficult to generate an arbitrary pulse pattern.

Therefore, in the control unit 30A of the seed light source device 1A according to the second embodiment, the pulse pattern generator 31A is configured with a digital circuit, and the EOM driving pulse generator 32A is configured with an analog circuit that enables driving at a higher frequency than 1 GHz. Further, the pulse pattern generator 31A outputs the LD driving pulse signal S11 to the LD driving unit 21. In contrast, the EOM driving pulse generator 32A generates the EOM driving pulse signal S12 with a short pulse width on the basis of the EOM driving pulse pattern signal S31A obtained from the pulse pattern generator 31A, and outputs the EOM driving pulse signal S12 to the EOM driving unit 22. Therefore, while the pulse pattern generator 31A may be simply configured with a digital circuit, the EOM driving pulse generator 32A that is configured with an analog circuit is able to drive the EOM12 by a driving signal with a short pulse width while maintaining the variability of the repletion frequency or the like.

Figure 9:
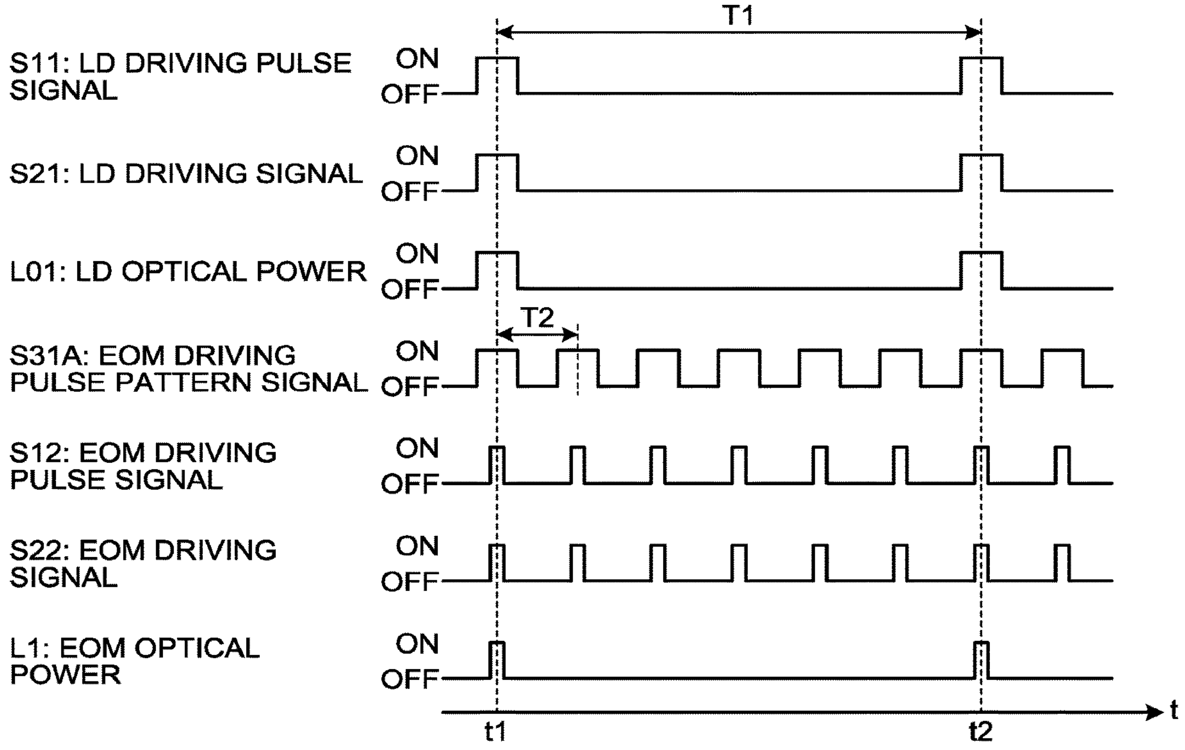
FIG. 9 is a diagram illustrating an example of time charts of signals and optical output in the second embodiment.

FIG. 9 is a diagram illustrating an example of time charts of signals and optical output in the seed light source device 1A.

As illustrated in FIG. 9, the LD driving pulse signal S11 that is output by the pulse pattern generator 31A of the control unit 30A to the LD driving unit 21 has the repetition period T1 and the repetition frequency f1=1/T1, which is constant. Further, the laser light L01 (LD optical output) output from the LD 11 becomes pulsed laser light formed of an optical pulse train that is synchronized with the LD driving pulse signal S11 and the LD driving signal S21. Here, as illustrated in FIG. 9, the pulse widths of the LD driving pulse signal Sit, the LD driving signal S21, and the laser light L01 are relatively large.

In contrast, the EOM driving pulse pattern signal S31A that is output by the pulse pattern generator 31A of the control unit 30A to the EOM driving pulse generator 32A has the repetition period T2 and a pulse width that is as wide as the LD driving pulse signal S11. The repetition frequency is set to f2=1/T2, which is larger than f1. In contrast, the EOM driving pulse signal S12 that is output by the EOM driving pulse generator 32A to the EOM driving unit 22 has a smaller pulse width than the EOM driving pulse pattern signal S31A. Therefore, the laser light L1 (EOM optical output) output from the EOM 12 becomes pulsed laser light that is extracted from the laser light L01 by the EOM 12 in accordance with the pulse width of the EOM driving signal S22 and that has the repetition frequency f1. The repetition frequency f1 of the LD driving pulse signal S11 and the pulse width of the EOM driving pulse signal S12 are set to desired values with respect to the laser light L1 through settings made by a user, or the like.

Meanwhile, in the seed light source device 1A, similarly to the seed light source device 1, it is possible to output optical pulse with the preferred ON/OFF extinction ratio.

Figure 10:
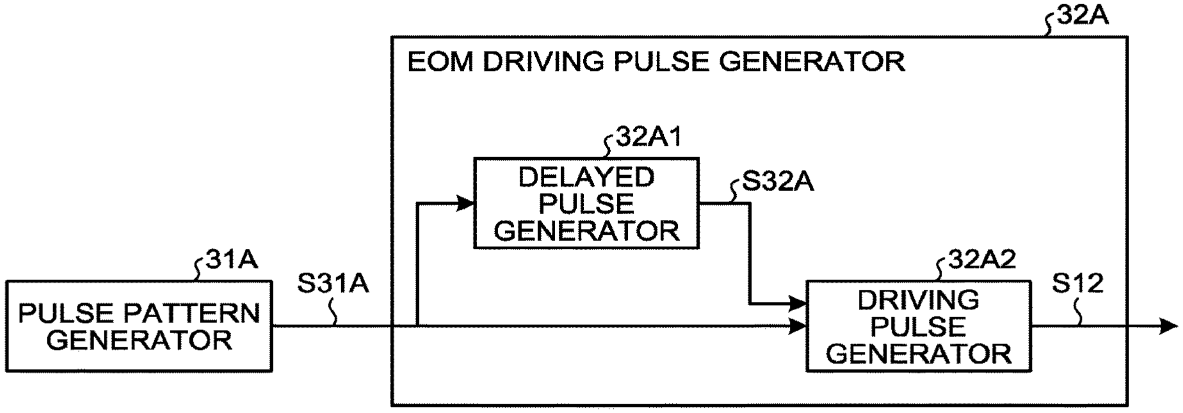
FIG. 10 is a block diagram of a pulse pattern generator and an EOM driving pulse generator.

FIG. 10 is a block diagram of the pulse pattern generator 31A and the EOM driving pulse generator 32A. The EOM driving pulse generator 32A includes a delayed pulse generator 32A1 and a driving pulse generator 32A2.

In the EOM driving pulse generator 32A, the EOM driving pulse pattern signal S31A input from the pulse pattern generator 31A is divided into two by a divider (not illustrated). The delayed pulse generator 32A1 generates a delayed pulse signal S32A on the basis of one of the divided EOM driving pulse pattern signals S31A, and outputs the delayed pulse signal S32A to the driving pulse generator 32A2. The driving pulse generator 32A2 generates the EOM driving pulse signal S12 on the basis of the other one of the divided EOM driving pulse pattern signals S31A and the delayed pulse signal S32A, and outputs the EOM driving pulse signal S12.

Figure 11:
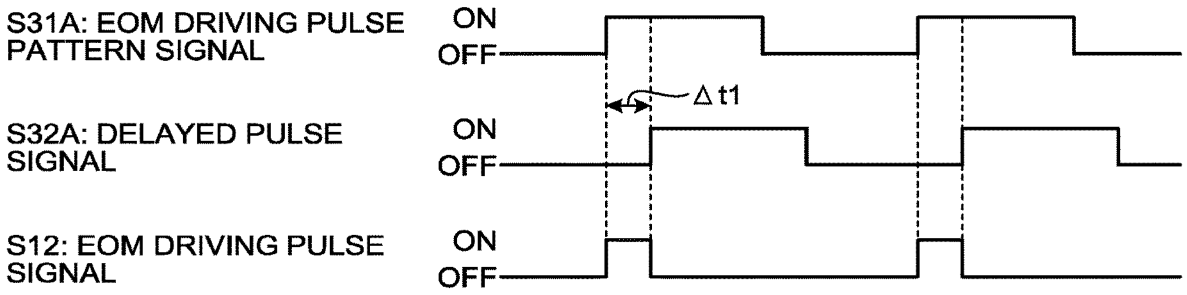
FIG. 11 is a diagram illustrating an example of time charts of signals in FIG. 10.

FIG. 11 is a diagram illustrating an example of time charts of the signals in FIG. 10. The delayed pulse generator 32A1 generates the delayed pulse signal S32A that is delayed by a time Δt1 from the EOM driving pulse pattern signal S31A. The driving pulse generator 32A2 generates the EOM driving pulse signal S12 with a pulse width of Δt1 such that the EOM driving pulse signal S12 is in the ON state when the EOM driving pulse pattern signal S31A is in the ON state and the delayed pulse signal S32A is in the OFF state, and is in the OFF state in other cases. By appropriately setting Δt1, it is possible to reduce the pulse width of the EOM driving pulse signal S12 relative to the pulse width of the EOM driving pulse pattern signal S31A.

Figure 12:
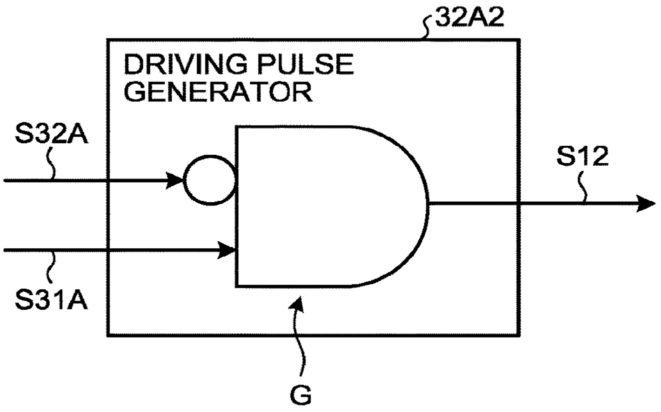
FIG. 12 is a block diagram illustrating an example of a configuration of a driving pulse generator.

FIG. 12 is a block diagram illustrating an example of a configuration of the driving pulse generator 32A2. The driving pulse generator 32A2 includes a gate circuit G in which a NOT gate and an AND gate are combined. The gate circuit G generates the EOM driving pulse signal S12 by obtaining logical AND of an inverted signal of the delayed pulse signal S32A and the EOM driving pulse pattern signal S31A.

Figure 13:
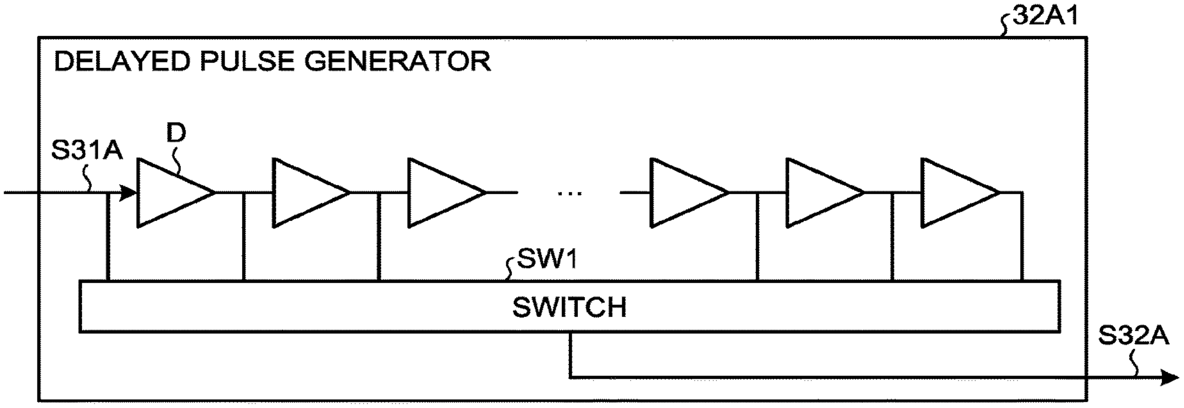
FIG. 13 is a block diagram illustrating an example of a configuration of a delayed pulse generator.

FIG. 13 is a block diagram illustrating an example of a configuration of the delayed pulse generator 32A1. The delayed pulse generator 32A1 includes a plurality of delayed gate circuits D that are connected in series, and a switch SW1 that is connected to an output side of each of the delayed gate circuits D. In the delayed pulse generator 32A1, the delayed gate circuits D temporally delays the EOM driving pulse pattern signal S31A, and the switch SW1 controls selection of output from any of the delayed gate circuits D in accordance with the amount of delay set in the control unit 30A, so that the delayed pulse signal S32A with the desired amount of delay is output.

Figure 14:
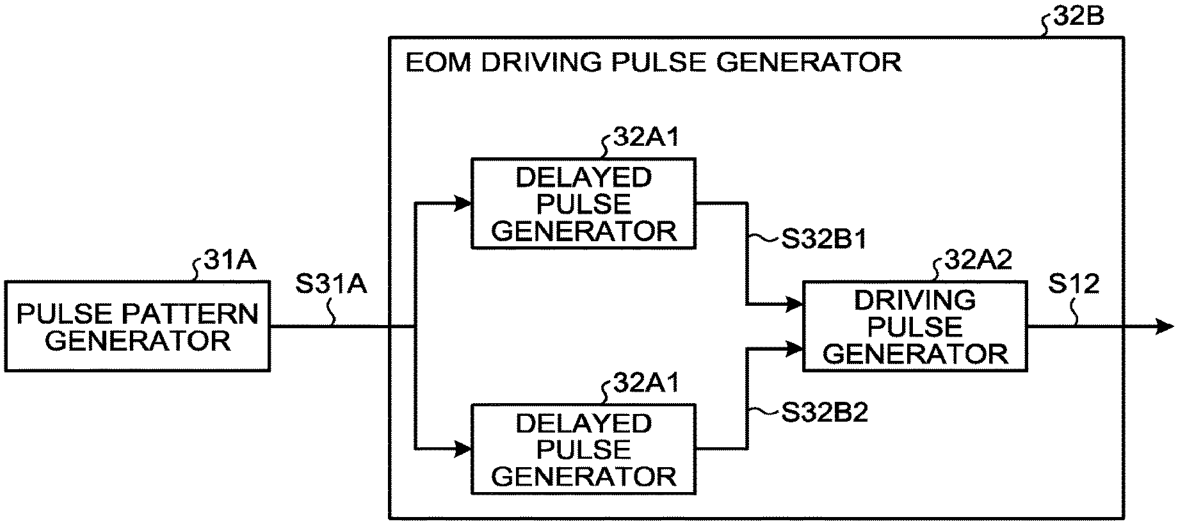
FIG. 14 is a block diagram illustrating another example of the configuration of the EOM driving pulse generator.

FIG. 14 is a block diagram illustrating an EOM driving pulse generator 32B that is another example of the configuration of the EOM driving pulse generator. The EOM driving pulse generator 32B is replaceable with the EOM driving pulse generator 32A of the seed light source device 1A, and includes a pair of delayed pulse generators 32A1, and the driving pulse generator 32A2.

In the EOM driving pulse generator 32B, the EOM driving pulse pattern signal S31A input from the pulse pattern generator 31A is divided into two by a divider (not illustrated). The two delayed pulse generators 32A1 and 32A1 respectively generate delayed pulse signals S32B1 and S32B2 on the basis of each of the divided EOM driving pulse pattern signals S31A, and output the corresponding delayed pulse signals to the driving pulse generator 32A2. The driving pulse generator 32A2 generates the EOM driving pulse signal S12 on the basis of the delayed pulse signals S32B1 and S32B2, and outputs it.

Figure 15:
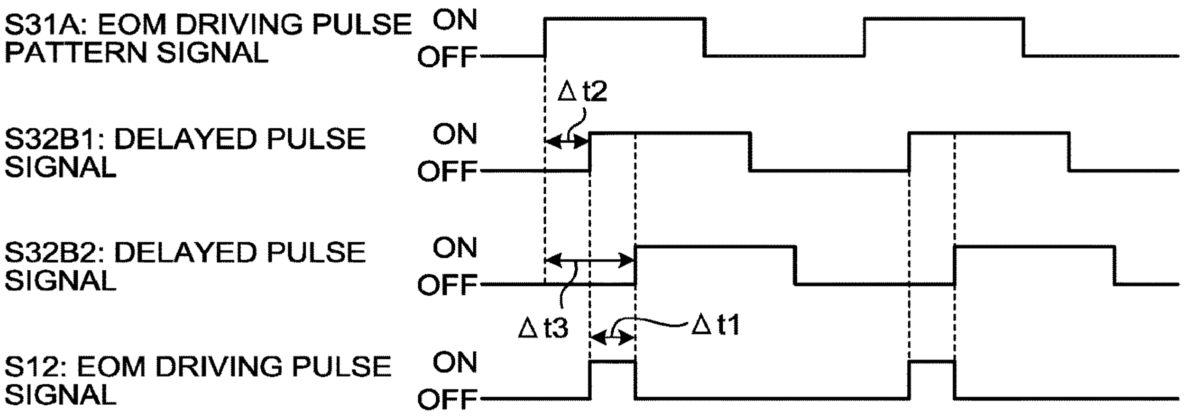
FIG. 15 is a diagram illustrating an example of time charts of signals in FIG. 14.

FIG. 15 is a diagram illustrating an example of times charts of the signals in FIG. 14. One of the delayed pulse generators 32A1 generates the delayed pulse signal S32B1 that is delayed by a time Δt2 from the EOM driving pulse pattern signal S31A. The other one of the delayed pulse generators 32A1 generates the delayed pulse signal S32B2 that is delayed by a time Δt3 from the EOM driving pulse pattern signal S31A. The driving pulse generator 32A2 generates the EOM driving pulse signal S12 with a pulse width of Δt1 (−Δt3−Δt2) such that the EOM driving pulse signal S12 is in the ON state when the delayed pulse signal S32B1 is in the ON state and the delayed pulse signal S32B2 is in the OFF state, and is in the OFF state in other cases. By appropriately setting Δt2 and Δt3, it is possible to reduce the pulse width of the EOM driving pulse signal S12 relative to the pulse width of the EOM driving pulse pattern signal S31A. Further, the EOM driving pulse generator 32B is able to adjust the delay amount with respect to the two divided EOM driving pulse pattern signals S31A, so that it is possible to generate the EOM driving pulse signal S12 with a more accurate pulse width.

Figure 16:
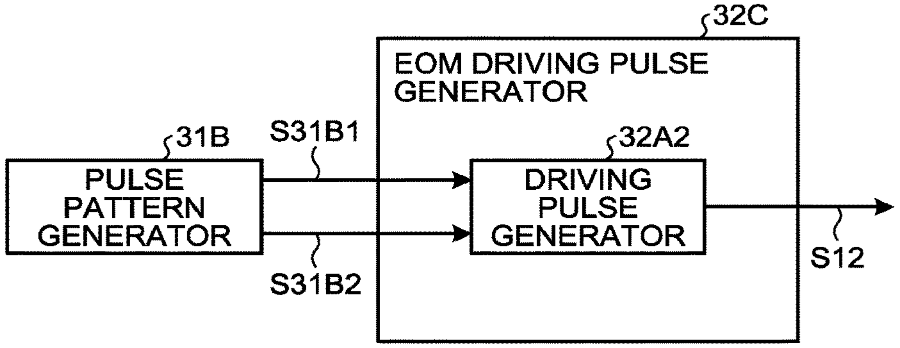
FIG. 16 is a block diagram illustrating another example of the configuration of the pulse pattern generator and the EOM driving pulse generator.

FIG. 16 is a block diagram illustrating a pulse pattern generator 31B and an EOM driving pulse generator 32C as another example of the configurations of the pulse pattern generator and the EOM driving pulse generator. The pulse pattern generator 31B and the EOM driving pulse generator 32C are replaceable with the pulse pattern generator 31A and the EOM driving pulse generator 32A of the seed light source device 1A. As illustrated in FIG. 16, the pulse pattern generator 31B generates EOM driving pulse pattern signals S31B1 and S31B2, and outputs them to the EOM driving pulse generator 32C. The EOM driving pulse pattern signals S31B1 and S31B2 are pulse signals that have the same waveforms as those of the delayed pulse signals S32B1 and S32B2 illustrated in FIG. 15 and that are delayed by different amounts. The EOM driving pulse generator 32C includes the driving pulse generator 32A2, generates the EOM driving pulse signal S12 with a smaller pulse width than the EOM driving pulse pattern signals S31B1 and S31B2 on the basis of the EOM driving pulse pattern signals S31B1 and S31B2, and outputs the EOM driving pulse signal S12.

When the pulse pattern generator 31B is configured with a digital circuit, for example, it is possible to set different delay amounts by adjusting a phase difference of each of operation clocks of the EOM driving pulse pattern signals S31B1 and S31B2.

Meanwhile, even in the seed light source device 1A that includes the EOM driving pulse generator 32A or 32B as illustrated in FIG. 10 or FIG. 14, or that includes the pulse pattern generator 31B and the EOM driving pulse generator 32C as illustrated in FIG. 16, it is possible to perform the control method of controlling the LD driving unit 21 and the EOM driving unit 22 such that the EOM 12 transitions to the ON state at least once while the LD 11 is in the OFF state by outputting the EOM driving pulse signal S12 as illustrated in FIGS. 7A, 7B, and 7C. In this case, by changing the delay amounts of the delayed pulse signal S32A, the delayed pulse signals S32B1 and S32B2, or the EOM driving pulse pattern signals S31B1 and S31B2 between when the LD 11 is in the OFF state and when the LD 11 is in the ON state, it is possible to generate and output the EOM driving pulse signal S12 as illustrated in FIGS. 7A, 7B, and 7C.

Figure 17A:
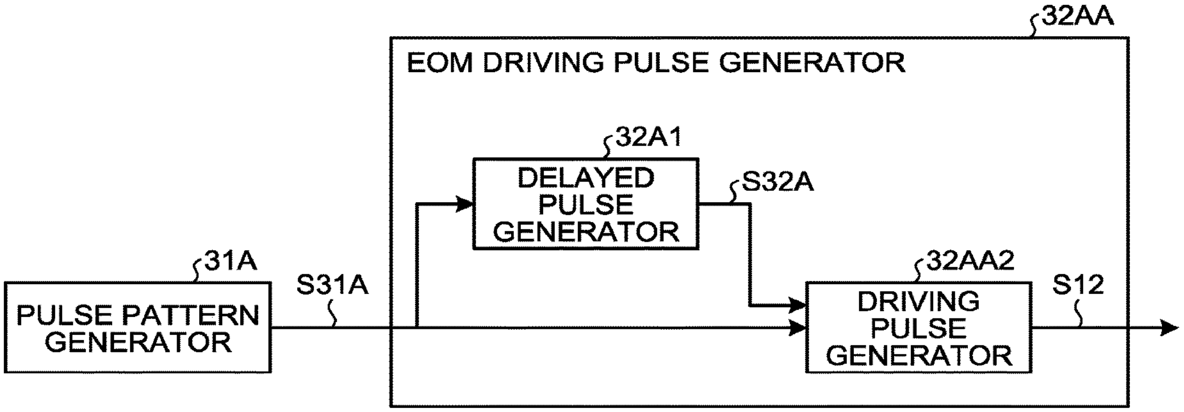
FIG. 17A is a block diagram illustrating a still another example of the configuration of the EOM driving pulse generator.

Further, to output the EOM driving pulse signal S12 as illustrated in FIGS. 7A, 7B, and 7C, it may be possible to replace the EOM driving pulse generator 32A in the seed light source device 1A with an EOM driving pulse generator 32AA illustrated in FIG. 17A. The EOM driving pulse generator 32AA has a configuration obtained by replacing the driving pulse generator 32A2 in the EOM driving pulse generator 32A with a driving pulse generator 32AA2.

Figure 17B:
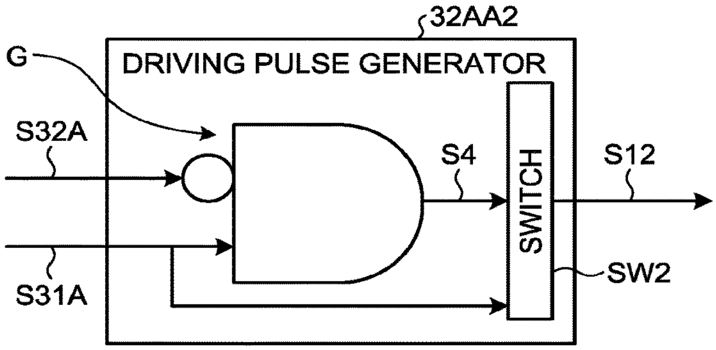
FIG. 17B is a block diagram illustrating a still another example of the configuration of the EOM driving pulse generator.

The driving pulse generator 32AA2 includes a divider (not illustrated), the gate circuit G, and a switch SW2 as illustrated in FIG. 17B.

The EOM driving pulse pattern signal S31A is divided into two by the divider (not illustrated). One of the divided EOM driving pulse pattern signals S31A is input to the switch SW2. The gate circuit G generates a logical AND pulse signal S4 by obtaining logical AND of the inverted signal of the delayed pulse signal S32A and the other one of the divided EOM driving pulse pattern signals S31A, and outputs the signal S4 to the switch SW2.

The switch SW2 outputs either one of the EOM driving pulse pattern signal S31A and the logical AND pulse signal S4 as the EOM driving pulse signal S12. In this case, the control unit controls the switch SW2 so as to output the logical AND pulse signal S4 with a smaller pulse width than the LD driving pulse signal as the EOM driving pulse signal S12 when the LD 11 is in the ON state and output the EOM driving pulse pattern signal S31A as the EOM driving pulse signal S12 when the LD 11 is in the OFF state. Therefore, it is possible to output the EOM driving pulse signal S12 as illustrated in FIGS. 7A, 7B, and 7C. In the pulse pattern generator 31A, it is possible to change the pulse width and the repetition period of the EOM driving pulse pattern signal S31A between when the LD 11 is in the ON state and when the LD 11 is in the OFF state, and it is possible to generate the EOM driving pulse signal S12 with a desired pulse width when the LD 11 is in the ON state and with a desired duty ratio during the repetition period T1 of the pulse modulation for the LD 11.

Figure 18A:
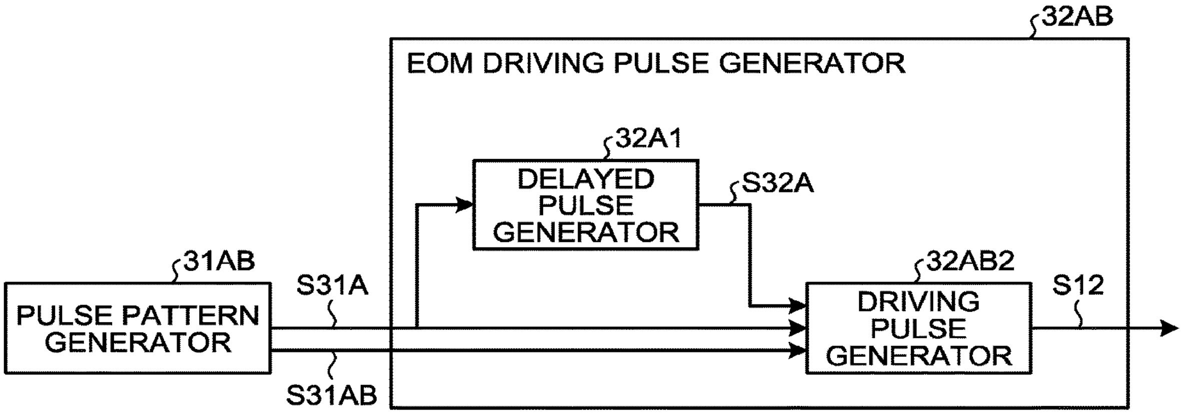
FIG. 18A is a block diagram illustrating a still another example of the configuration of the pulse pattern generator and the EOM driving pulse generator.

Further, to output the EOM driving pulse signal S12 as illustrated in FIGS. 7A, 7B, and 7C, it may be possible to replace the pulse pattern generator 31A and the EOM driving pulse generator 32A in the seed light source device 1A with a pulse pattern generator 31AB and an EOM driving pulse generator 32AB as illustrated in FIG. 18A. The EOM driving pulse generator 32AB has a configuration obtained by replacing the driving pulse generator 32A2 (FIG. 10) in the EOM driving pulse generator 32A with a driving pulse generator 32AB2.

The pulse pattern generator 31AB is configured to output the EOM driving pulse pattern signal S31A and an EOM driving pulse pattern signal S31AB having different pulse widths or different repetition periods or having different pulse widths and different repetition periods. The driving pulse generator 32AB2 includes the gate circuit G and a switch SW3 as illustrated in FIG. 18B.

The EOM driving pulse pattern signal S31AB is input to the switch SW3. The gate circuit G generates the logical AND pulse signal S4 by obtaining logical AND of the inverted signal of the delayed pulse signal S32A and the EOM driving pulse pattern signal S31A, and outputs the signal S4 to the switch SW3.

The switch SW3 outputs either one of the EOM driving pulse pattern signal S31AB and the logical AND pulse signal S4 as the EOM driving pulse signal S12. In this case, the control unit controls the switch SW3 so as to output the logical AND pulse signal S4 with a smaller pulse width than the LD driving pulse signal S11 as the EOM driving pulse signal S12 when the LD 11 is in the ON state and output the EOM driving pulse pattern signal S31AB as the EOM driving pulse signal S12 when the LD 11 is in the OFF state. Therefore, it is possible to output the EOM driving pulse signal S12 as illustrated in FIGS. 7A, 7B, and 7C. In the configurations in FIGS. 18A and 18B, the pulse pattern generator 31AB outputs the EOM driving pulse pattern signals S31A and S31AB having different pulse widths or different repetition periods or having different pulse widths and different repetition periods. In this case, the EOM driving pulse pattern signal S31A is set such that the EOM driving pulse signal S12 has a desired pulse width when the LD 11 is in the ON state. Further, the EOM driving pulse pattern signal S31AB is set such that the EOM driving pulse signal S12 has a desired duty ratio during the repetition period T1 of the pulse modulation for the LD 11. Therefore, unlike the configurations in FIGS. 17A and 17B, it is not necessary to change the pulse width and the repetition period between when the LD 11 is in the ON state and when the LD 11 is in the OFF state.

Figure 18B:
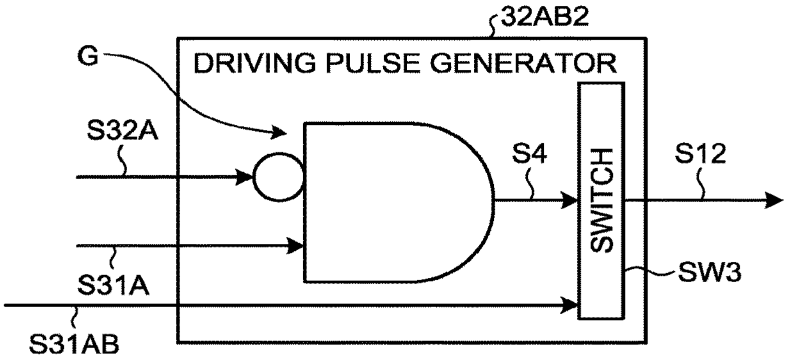
FIG. 18B is a block diagram illustrating a still another example of the configuration of the pulse pattern generator and the EOM driving pulse generator.
Figure 19A:
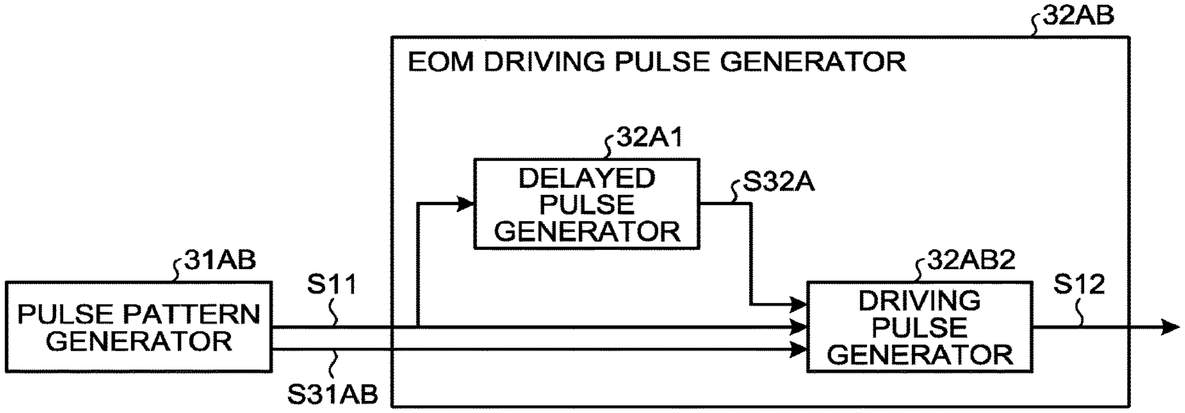
FIG. 19A is a block diagram illustrating a configuration of a modification of the configurations illustrated in FIGS. 18A and 18B.
Figure 19B:
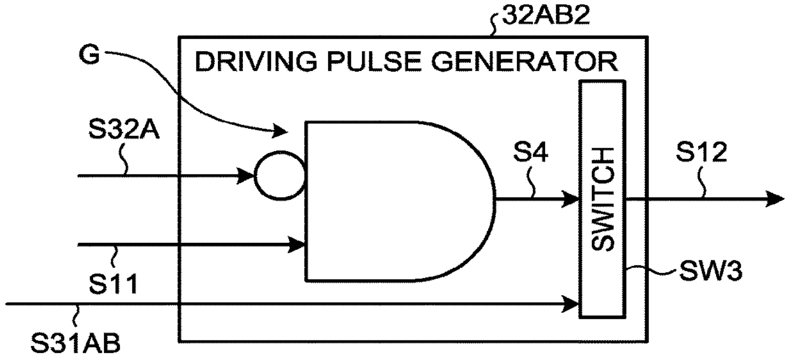
FIG. 19B is a block diagram illustrating a configuration of a modification of the configurations illustrated in FIGS. 18A and 18B.

Meanwhile, the configurations illustrated in FIGS. 18A and 18B may be changed, as a modification as illustrated in FIGS. 19A and 19B, such that the pulse pattern generator 31AB outputs the LD driving pulse signal S11 instead of the EOM driving pulse pattern signal S31A as the pulse pattern signal to the EOM driving pulse generator 32AB. In this case, the delayed pulse generator 32A1 generates the delayed pulse signal S32A from the input LD driving pulse signal S11, and outputs the signal S32A to the driving pulse generator 32AB2. The gate circuit G generates the logical AND pulse signal S4 by obtaining logical AND of the inverted signal of the delayed pulse signal S32A and the LD driving pulse signal S11, and outputs the signal S4 to the switch SW3.

The switch SW3 outputs either one of the EOM driving pulse pattern signal S31AB and the logical AND pulse signal S4 as the EOM driving pulse signal S12. In this case, the control unit controls the switch SW3 so as to output the logical AND pulse signal S4 with a smaller pulse width than the LD driving pulse signal S11 as the EOM driving pulse signal S12 when the LD 11 is in the ON state and output the EOM driving pulse pattern signal S31AB as the EOM driving pulse signal S12 when the LD 11 is in the OFF state. Therefore, it is possible to output the EOM driving pulse signal S12 as illustrated in FIGS. 7A, 7B, and 7C.

Meanwhile, the driving pulse generator 32A2 illustrated in FIG. 12 and the delayed pulse generator 32A1 illustrated in FIG. 13 are one examples of the configurations, and, for example, the delayed pulse generator may be configured with a comparator instead of the delayed gate circuit, or may be configured with both of the delayed gate circuit and the comparator. With use of the comparator, a rising/falling time of the delayed pulse signal from the delayed pulse generator 32A1 can be made steep, so that even when the rising/falling time of the EOM driving pulse pattern signal S31A from the pulse pattern generator 31A is large, it is possible to generate the EOM driving pulse signal S12 with a desired pulse width. Further, the driving pulse generator 32A2 (FIG. 12) may be configured with other logical gate circuits (AND, OR, NOR, or XOR) or flip-flop circuits (T-F/F or RS-F/F).

Third Embodiment

Figure 20:
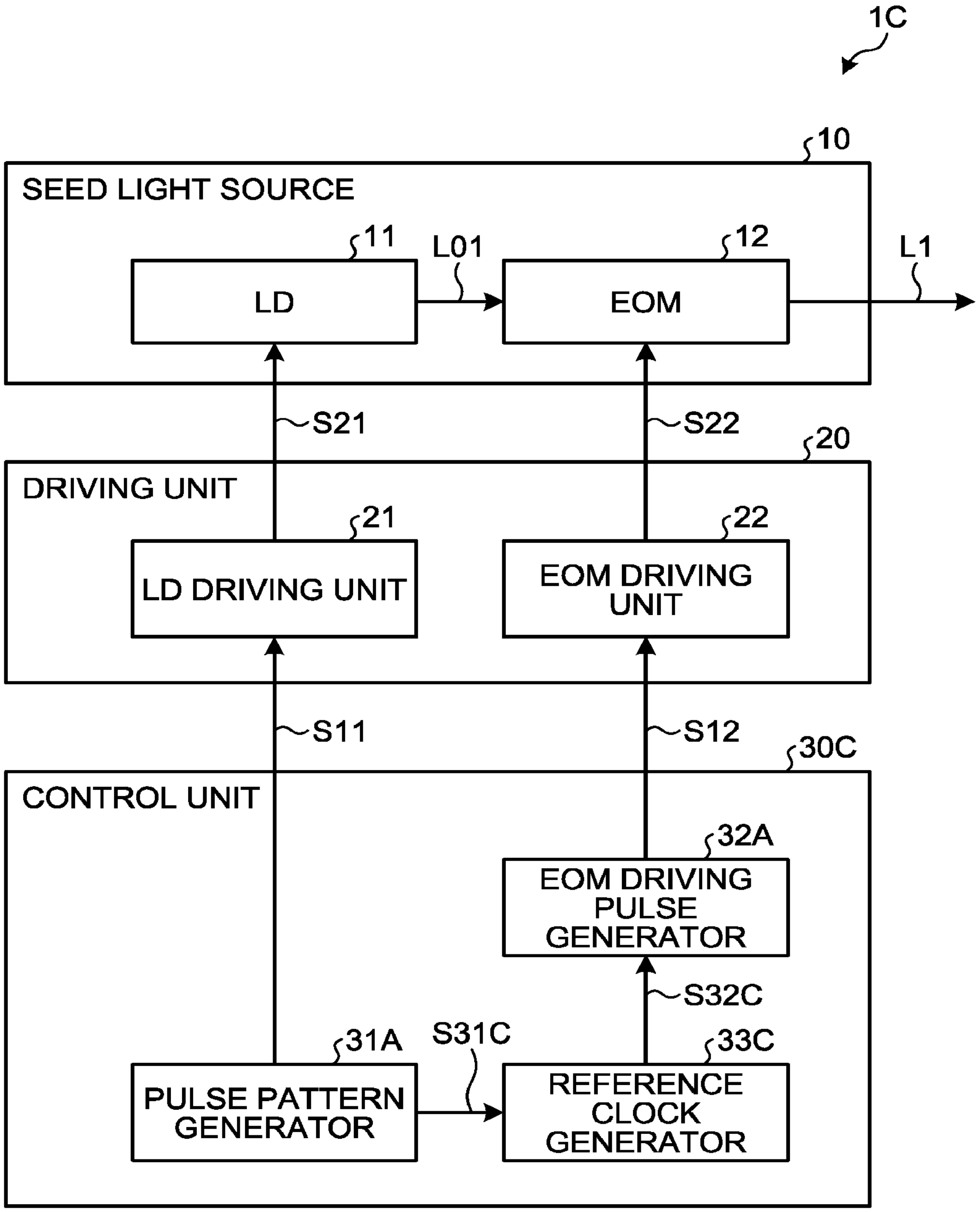
FIG. 20 is a block diagram of a seed light source device according to a third embodiment.

FIG. 20 is a block diagram of a seed light source device as a pulsed laser device according to a third embodiment. A seed light source device 1C has a configuration obtained by replacing the control unit 30A with a control unit 30C in the configuration of the seed light source device 1A illustrated in FIG. 8. The control unit 30C has a configuration obtained by adding a reference clock generator 33C to the configuration of the control unit 30A.

The pulse pattern generator 31A of the control unit 30C generates and outputs the LD driving pulse signal S11 as a pulse pattern signal to be used to perform pulse modulation in the LD 11, and outputs a synchronous signal S31C to the reference clock generator 33C.

The reference clock generator 33C generates a reference clock signal S32C to be used to perform pulse modulation in the EOM 12 on the basis of the synchronous signal S31C, and outputs the signal S32C to the EOM driving pulse generator 32A. The reference clock signal S32C is a signal that is synchronized with the LD driving pulse signal S11.

The EOM driving pulse generator 32A of the control unit 30C generates and outputs the EOM driving pulse signal S12 on the basis of the reference clock signal S32C. Specifically, the EOM driving pulse generator 32A generates the EOM driving pulse signal S12 as a pulse pattern signal on the basis of the reference clock signal S32C, and outputs the signal S12.

Here, if temporal variation (hereinafter, jitter) of a pulse pattern generated by the pulse pattern generator 31A is large, a driving pulse signal for the LD 11 or the EOM 12 may be degraded. For example, in a general-purpose digital circuit, in some cases, a jitter characteristic reaches a few hundred picoseconds, and therefore, particularly when the EOM 12 is driven with a pulse width of about 100 ps, the EOM driving pulse signal S12 varies due to the influence of the jitter. As a result, an optical pulse characteristic of the laser light L1 output by the EOM 12 may be degraded.

In contrast, in the control unit 30C, the pulse pattern generator 31A is configured with a general-purpose digital circuit and does not directly generate the EOM driving pulse signal S12. Further, the reference clock generator 33C is configured with a clock source with low jitter and generates the EOM driving pulse signal S12. Therefore, it is possible to drive the EOM 12 using the EOM driving pulse signal S12 with less variation. By using, as the reference clock generator 33C, a jitter cleaner based on Phase-Locked Loop (PLL) for example, it is possible to generate a pulse pattern signal (the reference clock signal S32C) that is synchronized with the LD driving pulse signal S11 output by the pulse pattern generator 31A and that has low jitter.

Meanwhile, the frequency of the reference clock signal S32C generated by the reference clock generator 33C may be variable or fixed. When the frequency is fixed, if the frequency is set to be larger than a maximum repetition frequency of the laser light L1 required by the seed light source device 1C, it becomes possible to obtain a desired repetition frequency of the laser light L1 by adjusting the repetition frequency of the LD driving pulse signal S11.

Further, even in the seed light source device 1C, the control unit 30C may be configured to perform the control method of controlling the LD driving unit 21 and the EOM driving unit 22 such that the EOM 12 transitions to the ON state at least once while the LD 11 is in the OFF state by outputting the EOM driving pulse signal S12 as illustrated in FIGS. 7A, 7B, and 7C.

Fourth Embodiment

Figure 21:
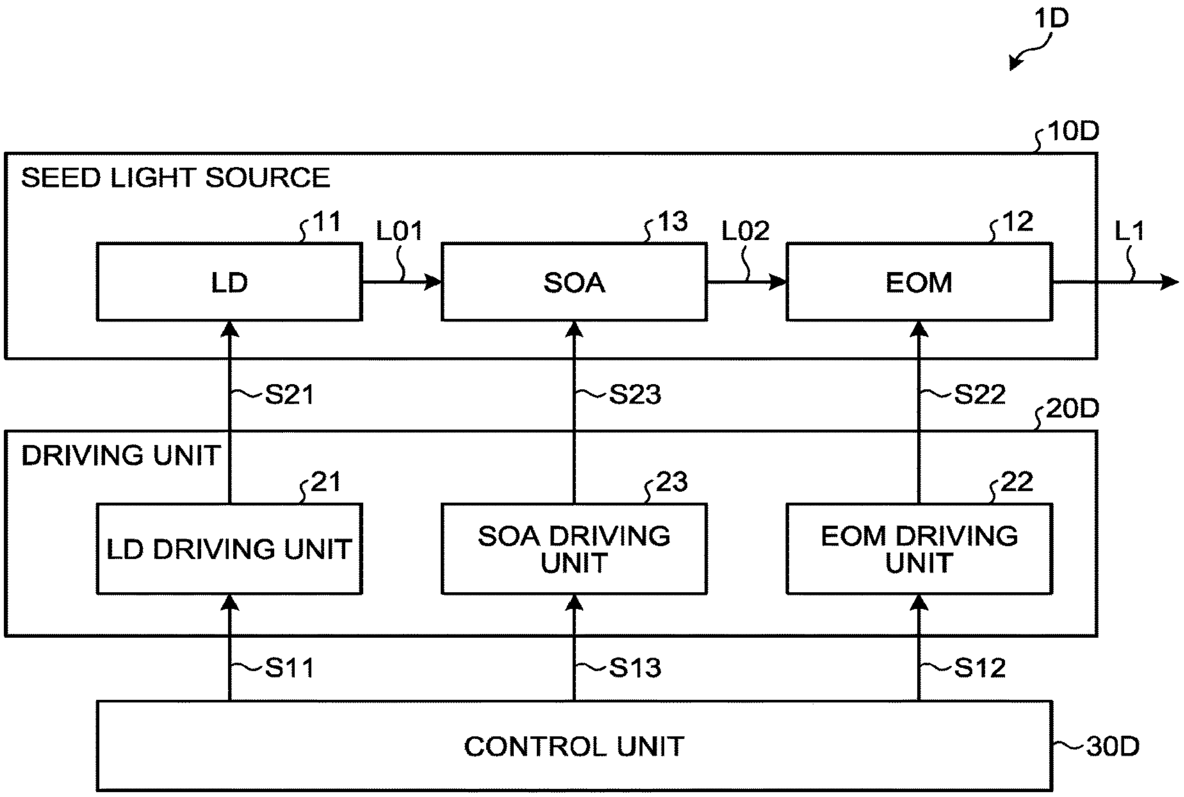
FIG. 21 is a block diagram of a seed light source device according to a fourth embodiment.

FIG. 21 is a block diagram of a seed light source device as a pulsed laser device according to a fourth embodiment. A seed light source device 1D includes a seed light source 10D, a driving unit 20D, and a control unit 30D.

The seed light source 10D includes the LD 11, the EOM 12, and a Semiconductor Optical Amplifier (SOA) 13. The driving unit 20D includes the LD driving unit 21, the EOM driving unit 22, and an SOA driving unit 23, which serves as an optical amplifier driving unit. The SOA driving unit 23 can be configured with a known SOA driving circuit.

The control unit 30D is configured with a digital circuit for performing a control process on each of the driving units included in the driving unit 20D. The control unit 30D outputs the LD driving pulse signal S11 to the LD driving unit 21, outputs the EOM driving pulse signal S12 to the EOM driving unit 22, and outputs an SOA driving pulse signal S13 to the SOA driving unit 23. The SOA driving pulse signal S13 is a pulse signal that is in the ON state in a predetermined repetition period and with a certain pulse width and is in the OFF state in other periods.

The LD 11 outputs the laser light L01 of a single wavelength. The LD driving unit 21 outputs the LD driving signal S21 to the LD 11 and drives the LD 11 by pulse modulation. Therefore, the laser light L01 becomes pulsed laser light that is pulse-modulated. The SOA 13 receives the laser light L01, amplifies the laser light L01, and outputs the amplified laser light L01 as the laser light L02. The SOA driving unit 23 outputs an SOA driving signal S23 that is a signal corresponding to the SOA driving pulse signal S13, and drives the SOA 13 by pulse modulation. Therefore, the laser light L02 becomes pulsed laser light that is obtained by performing pulse modulation on the laser light L01. The EOM 12 receives the laser light L02, performs intensity modulation on the laser light L02, and outputs the modulated laser light L02 as the laser light L1. The EOM driving unit 22 outputs the EOM driving signal S22 to the EOM 12 and drives the EOM 12 by pulse modulation. Therefore, the laser light L1 becomes pulsed laser light that is obtained by performing pulse modulation on the laser light L02.

Here, in the seed light source device 1D, the control unit 30D performs a control method of controlling the LD driving unit 21, the EOM driving unit 22, and the SOA driving unit 23 so as to realize pulse modulation for the LD 11, pulse modulation for the SOA 13, and pulse modulation for the EOM 12 such that the EOM 12 transitions to the ON state at least while the LD 11 and the SOA 13 are in the ON state and such that the EOM 12 transitions to the OFF state at least once while the LD 11 and the SOA 13 are in the OFF state.

Figure 22:
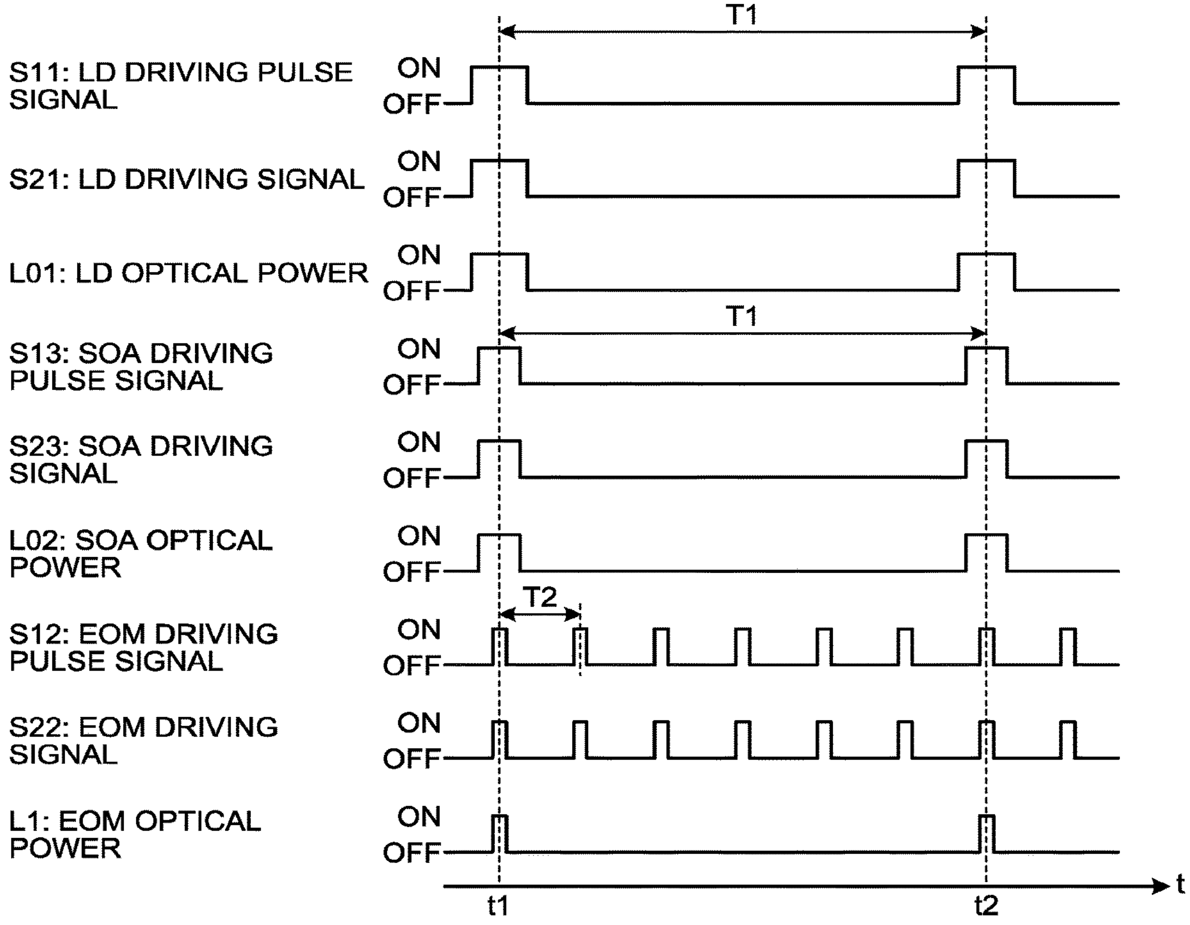
FIG. 22 is a diagram illustrating an example of time charts of signals and optical output in FIG. 21.

FIG. 22 is a diagram illustrating an example of time charts of signals and optical output in the seed light source device 1D.

As illustrated in FIG. 22, the LD driving pulse signal S11 is a pulse signal that is in the ON state with a constant pulse width centered at the times t1 and t2 and is in the OFF state in other periods in a time range illustrated in the figure. The LD driving pulse signal S11 has the repetition period T1 and the repetition frequency $f1=1/T1$, which is constant. The laser light L01 (LD optical output) also becomes pulsed laser light formed of an optical pulse train that is synchronized with the LD driving pulse signal S11 and the LD driving signal S21.

The SOA driving pulse signal S13 is a pulse signal that has a smaller pulse width than the LD driving pulse signal S11, has the same repetition frequency f1, and has the same repetition period T1. The SOA driving signal S23 is a signal that is synchronized with the SOA driving pulse signal S13. Therefore, the laser light L02 (SOA optical output) output from the SOA 13 becomes pulsed laser light that is formed of an optical pulse train synchronized with the SOA driving pulse signal S13 and the SOA driving signal S23 and that is obtained by causing the SOA 13 to amplify the laser light L01 and extract the laser light L01 in accordance with the pulse width of the SOA driving signal S23.

In contrast, the repetition period of the EOM driving pulse signal S12 is T2 that is smaller than T1. Therefore, the repetition frequency of the EOM driving pulse signal S12 is $f2=1/T2$, which is constant, where f2 is larger than f1 and $f2=6\times f1$ in the example illustrated in FIG. 22. Meanwhile, the EOM driving signal S22 is a signal that is synchronized with the EOM driving pulse signal S12.

In this manner, the repetition frequency f2 of the EOM driving pulse signal S12 is set to be constant and f2 is set to be six times larger than the repetition frequencies f1 of the LD driving pulse signal S11 and the SOA driving pulse signal S13, so that the EOM 12 transitions to the ON state five times while the LD 11 and the SOA 13 are in the OFF state.

Further, timings of the LD driving signal S21, the EOM driving signal S22, and the SOA driving signal S23 are adjusted such that the EOM 12 transitions to the ON state at least while the LD 11 and the SOA 13 are in the ON state. Specifically, the EOM 12 transitions to the ON state while the LD 11 and the SOA 13 are in the ON state centered at the times t1 and t2. Therefore, the laser light L1 (EOM optical output) output from the EOM 12 becomes pulsed laser light that is formed of an optical pulse train with the repetition frequency f1 and the same pulse width as the pulse width of the EOM driving signal S22 and that is extracted from the laser light L02 by the EOM 12 in accordance with the pulse width of the EOM driving signal S22. The repetition frequencies f1 of the LD driving pulse signal S11 and the SOA driving pulse signal S13 and the pulse width of the EOM driving pulse signal S12 are set to desired values with respect to the laser light L1 through settings made by a user, or the like.

In this manner, by increasing the repetition frequency f2 of the pulse modulation for the EOM 12 relative to the repetition frequencies f1 of the pulse modulation for the LD 11 and the SOA 13, it is possible to increase the duty ratio of the pulse modulation for the EOM 12. In other words, in the seed light source device 1D, the control unit 30D performs control so as to realize the time charts illustrated in FIG. 22, so that it is possible to set the repetition frequency of the laser light L1 to the desired frequency f1 and increase the duty ratio of the EOM driving signal S22 relative to a duty ratio of the pulse modulation for the SOA 13 during the repetition period T1 of the pulse modulation for the SOA 13. Meanwhile, the duty ratio of the pulse modulation for the SOA 13 is represented by (a time in which the SOA 13 is in the ON state during the repetition period T1)/(the repetition period T1). Therefore, in the seed light source device 1D, even when the laser light L1 with a low duty ratio is output, it is possible to drive the EOM 12 with the improved duty ratio, so that it is possible to output power with the preferred ON/OFF extinction ratio.

Further, because the seed light source device 1D includes the SOA 13, it is possible to output the laser light L1 with the enhanced power. Furthermore, in the seed light source device 1D, when the SOA 13 is in the OFF state, the laser light L01 output from the LD 11 is absorbed and blocked by the SOA 13 and therefore is not output to the outside. Therefore, it is possible to improve the ON/OFF extinction ratio of the laser light L1 output from the seed light source 10D.

Figure 23:
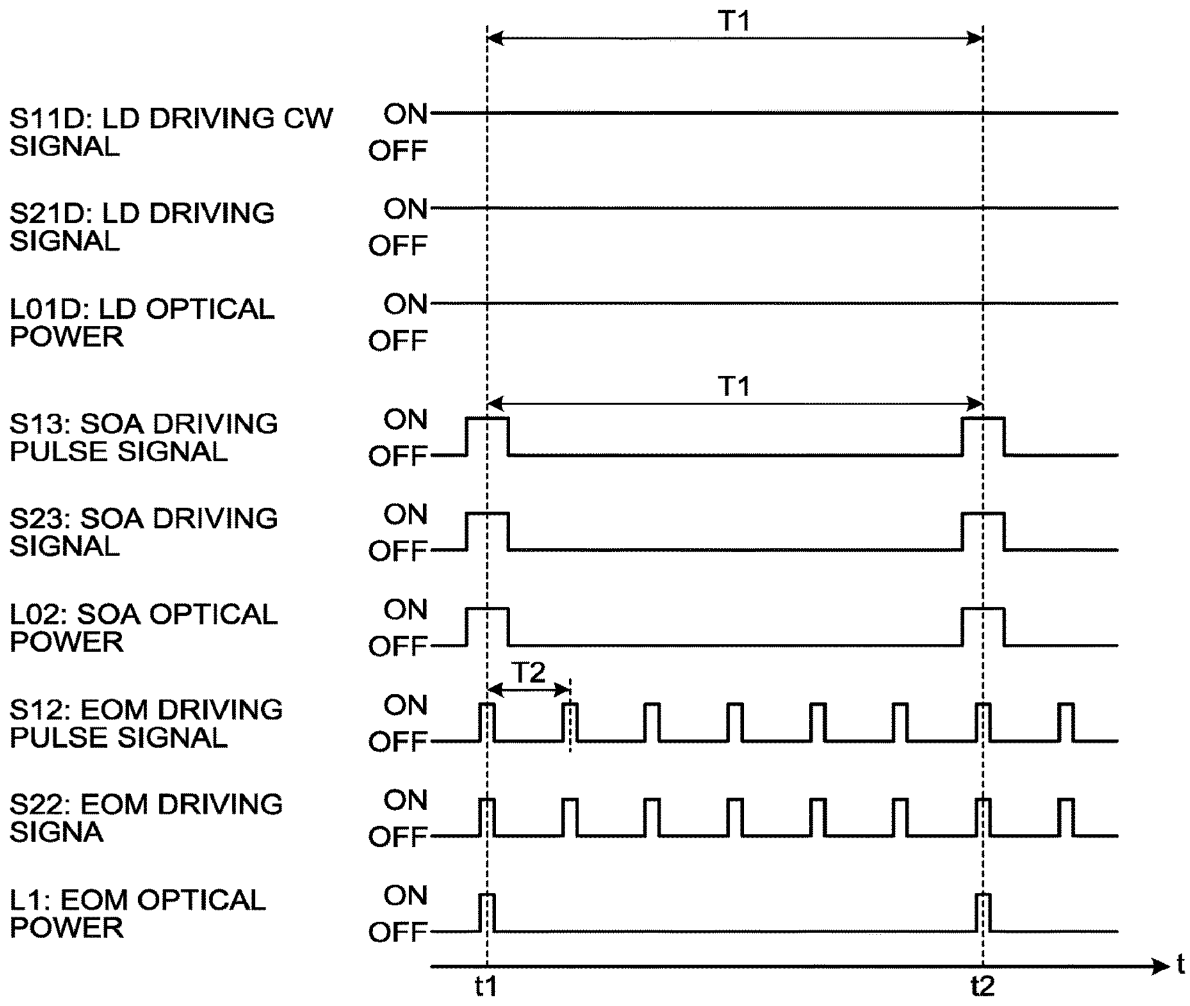
FIG. 23 is a diagram illustrating another example of the time charts of the signals and the optical output in FIG. 21.

Meanwhile, while the LD 11 is driven by pulse in the example of the time charts illustrated in FIG. 22, the LD 11 may be driven by continuous wave (CW). FIG. 23 is a diagram illustrating another example of the time charts of the signals and the optical output in FIG. 21. In the example of the time charts illustrated in FIG. 23, the control unit 30D outputs an LD driving CW signal S11D to the LD driving unit 21. The LD driving unit 21 outputs an LD driving signal S21D as a CW signal to the LD 11. As a result, the laser light (LD optical output) output from the LD 11 becomes laser light L01D as CW laser light.

Thereafter, similarly to the example in FIG. 22, the laser light L02 output from the SOA 13 becomes pulsed laser light that is formed of an optical pulse train synchronized with the SOA driving pulse signal S13 and the SOA driving signal S23 and that is obtained by causing the SOA 13 to amplify the laser light L01D and extract the laser light L01D in accordance with the pulse width of the SOA driving signal S23. Further, the laser light L1 output from the EOM 12 becomes pulsed laser light that is formed of an optical pulse train with the repetition frequency f1 and the same pulse width as the pulse width of the EOM driving signal S22 and that is extracted from the laser light L02 by the EOM 12 in accordance with the pulse width of the EOM driving signal S22.

To realize the example of the time charts illustrated in FIG. 23, the control unit 30D causes the EOM 12 to transition to the ON state while the SOA 13 is in the ON state and causes the EOM 12 to transition to the ON state at least once while the SOA 13 is in the OFF state by controlling the SOA 13 and the EOM 12 such that the repetition frequency of the pulse modulation for the EOM 12 becomes larger than the repetition frequency of the pulse modulation for the SOA 13. Therefore, it is possible to reduce, from the control unit 30D, a component, such as a circuit, that outputs a pulse pattern signal to be used to perform pulse modulation in the LD 11, so that the configuration of the control unit 30D can be simplified. Meanwhile, assuming that N is an integer equal to or larger than 2, it is possible to cause the EOM 12 to transition to the ON state at least while the SOA 13 is in the ON state when the repetition frequency f2 of the EOM driving signal S22 is N times larger than the repetition frequency f1 of the SOA driving signal S23. It is more preferable to set N to a value by which the duty ratio of the EOM driving signal S22 during the repetition period T1 of the pulse modulation for the SOA 13 reaches approximately 50%.

Further, even in the seed light source device 1D, the control unit 30D may be configured to perform the control method of controlling the SOA driving unit 23 or both of the LD driving unit 21 and the SOA driving unit 23 together with the EOM driving unit 22 such that the EOM 12 transitions to the ON state at least once while the SOA 13 or the LD 11 and the SOA 13 is/are in the OFF state by outputting the EOM driving pulse signal S12 as illustrated in FIGS. 7A, 7B, and 7C.

Fifth Embodiment

Figure 24:
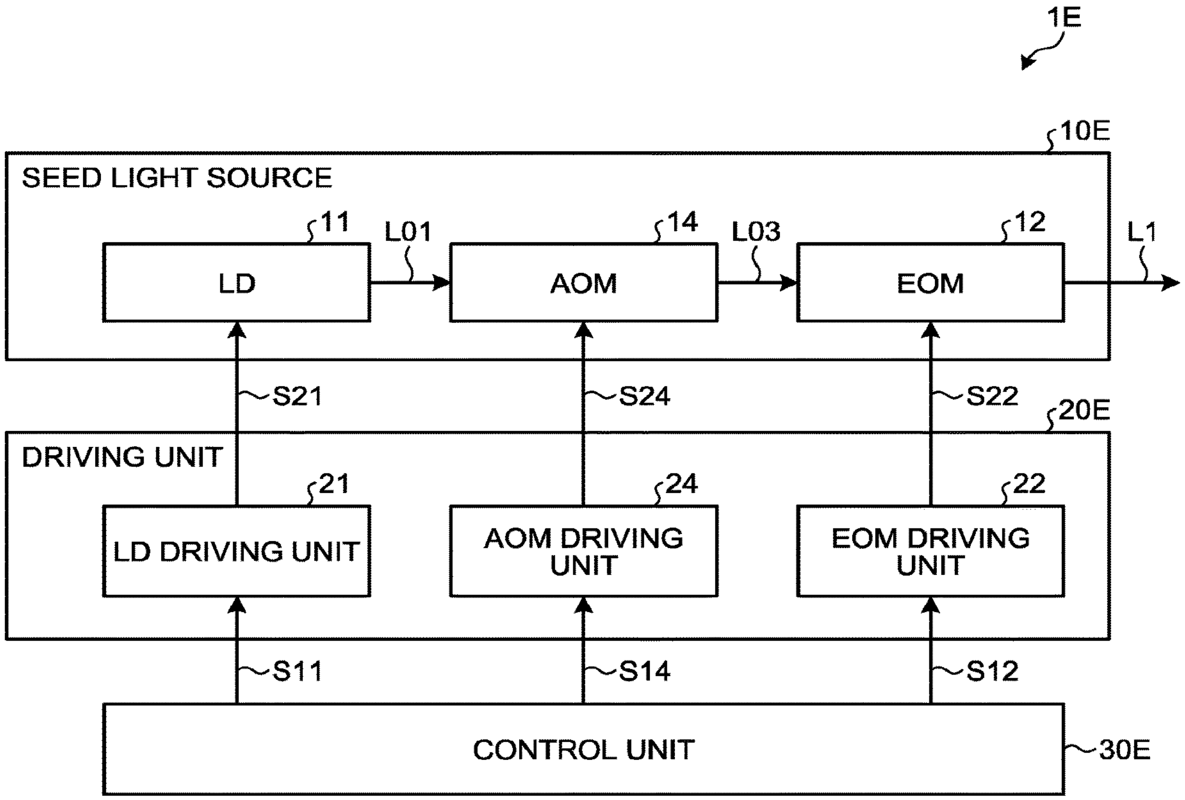
FIG. 24 is a block diagram of a seed light source device according to a fifth embodiment.

FIG. 24 is a block diagram of a seed light source device as a pulsed laser device according to a fifth embodiment. A seed light source device 1E includes a seed light source 10E, a driving unit 20E, and a control unit 30E.

The seed light source device 1E is configured by replacing the SOA 13 with an Acousto-Optic Modulator (AOM) 14 in the seed light source device 1D illustrated in FIG. 21. Therefore, the seed light source 10E includes the LD 11, the EOM 12, and the AOM 14. The driving unit 20E includes the LD driving unit 21, the EOM driving unit 22, and an AOM driving unit 24, which serves as an acousto-optic modulator driving unit. The AOM driving unit 24 can be configured using a known AOM driving circuit.

The control unit 30E is configured with a digital circuit, outputs the LD driving pulse signal S11 to the LD driving unit 21, outputs the EOM driving pulse signal S12 to the EOM driving unit 22, and outputs an AOM driving pulse signal to the AOM driving unit 24.

The AOM 14 receives the laser light L01 that is pulse-modulated pulsed laser light output from the LD 11, performs intensity modulation on the laser light L01, and outputs the modulated laser light L01 as the laser light L03. The AOM driving unit 24 outputs an AOM driving signal S24 that is a signal corresponding to the AOM driving pulse signal S14, and drives the AOM 14 by pulse modulation. Therefore, the laser light L03 becomes pulsed laser light that is obtained by performing pulse modulation on the laser light L01. The EOM 12 receives the laser light L03, performs intensity modulation on the laser light L03, and outputs the modulated laser light L03 as the laser light L1 that is obtained by performing pulse modulation on the laser light L03.

Here, in the seed light source device 1E, the control unit 30E performs a control method of controlling the LD driving unit 21, the EOM driving unit 22, and the AOM driving unit 24 so as to realize pulse modulation for the LD 11, pulse modulation for the AOM 14, and pulse modulation for the EOM 12 such that the EOM 12 transitions to the ON state at least while the LD 11 and the AOM 14 are in the ON state and such that the EOM 12 transitions to the OFF state at least once while the LD 11 and the AOM 14 are in the OFF state.

For example, similarly to the example of the time charts illustrated in FIG. 22, by increasing the repetition frequency f2 of the pulse modulation for the EOM 12 relative to the repetition frequencies f1 of the pulse modulation for the LD 11 and the AOM 14, it is possible to increase the duty ratio of the pulse modulation for the EOM 12 relative to a duty ratio of the pulse modulation for the AOM 14 during the repetition period T1 of the pulse modulation for the AOM 14. Meanwhile, the duty ratio of the pulse modulation for the AOM 14 is represented by (a time in which the AOM 14 is in the ON state during the repetition period T1)/(the repetition period T1). In other words, in the seed light source device 1E, the control unit 30E performs control so as to realize the same time charts as those of the example illustrated in FIG. 22, so that it is possible to set the repetition frequency of the laser light L1 to the desired frequency f1 and increase the duty ratio of the EOM driving signal S22. Therefore, in the seed light source device 1E, even when the laser light L1 with a low duty ratio is output, it is possible to drive the EOM 12 with the increased duty ratio, so that it is possible to output power with the preferred ON/OFF extinction ratio.

Further, in the seed light source device 1E, when the AOM 14 is in the OFF state, the laser light L01 output from the LD 11 is blocked by the AOM 14 and therefore is not output to the outside. Therefore, it is possible to improve the ON/OFF extinction ratio of the laser light L1 output from the seed light source 10E.

Meanwhile, while the LD 11 is driven by pulse even in the seed light source device 1E, the LD 11 may be driven by CW. In this case, to realize the example of the time charts illustrated in FIG. 23, the control unit 30E causes the EOM 12 to transition to the ON state while the AOM 14 is in the ON state and causes the EOM 12 to transition to the ON state at least once while the AOM 14 is in the OFF state by controlling the AOM 14 and the EOM 12 such that the repetition frequency of the pulse modulation for the EOM 12 becomes larger than the repetition frequency of the pulse modulation for the AOM 14. Therefore, it is possible to reduce, from the control unit 30E, a component, such as a circuit, that outputs a pulse pattern signal to be used to perform pulse modulation in the LD 11, so that the configuration of the control unit 30E can be simplified. Meanwhile, assuming that N is an integer equal to or larger than 2, it is possible to cause the EOM 12 to transition to the ON state at least while the AOM 14 is in the ON state when the repetition frequency f2 of the EOM driving signal S22 is N times larger than the repetition frequency f1 of the AOM driving signal S24. It is more preferable to set N to a value by which the duty ratio of the EOM driving signal S22 during the repetition period T1 of the pulse modulation for the AOM 14 reaches approximately 50%.

Further, even in the seed light source device 1E, the control unit 30E may be configured to perform the control method of controlling the AOM driving unit 24 or both of the LD driving unit 21 and the AOM driving unit 24 together with the EOM driving unit 22 such that the EOM 12 transitions to the ON state at least once while the AOM 14 or the LD 11 and the AOM 14 is/are in the OFF state by outputting the EOM driving pulse signal S12 as illustrated in FIGS. 7A, 7B, and 7C.

(Control for Outputting Burst Pulse Train)

When laser processing is performed using a pulsed laser device, it is possible to realize optimal laser processing by outputting an optical pulse train in a burst mode. The seed light source devices according to the first to fifth embodiments are able to easily output a burst pulse train. In this case, the control unit adjusts the pulse width of the pulse modulation for the LD 11, the SOA 13, or the AOM 14, such that a pulse width of laser light, which is be input to the EOM 12, is set to a pulse width that corresponds to a period in which a desired burst pulse train is generated, a repetition frequency of the laser light is set to a repetition frequency of the desired burst pulse train, and a repetition frequency of the EOM driving pulse signal S12 is set to a repetition frequency that corresponds to the desired burst pulse train.

This will be described below taking the seed light source device 1 as an example.

Figure 25:
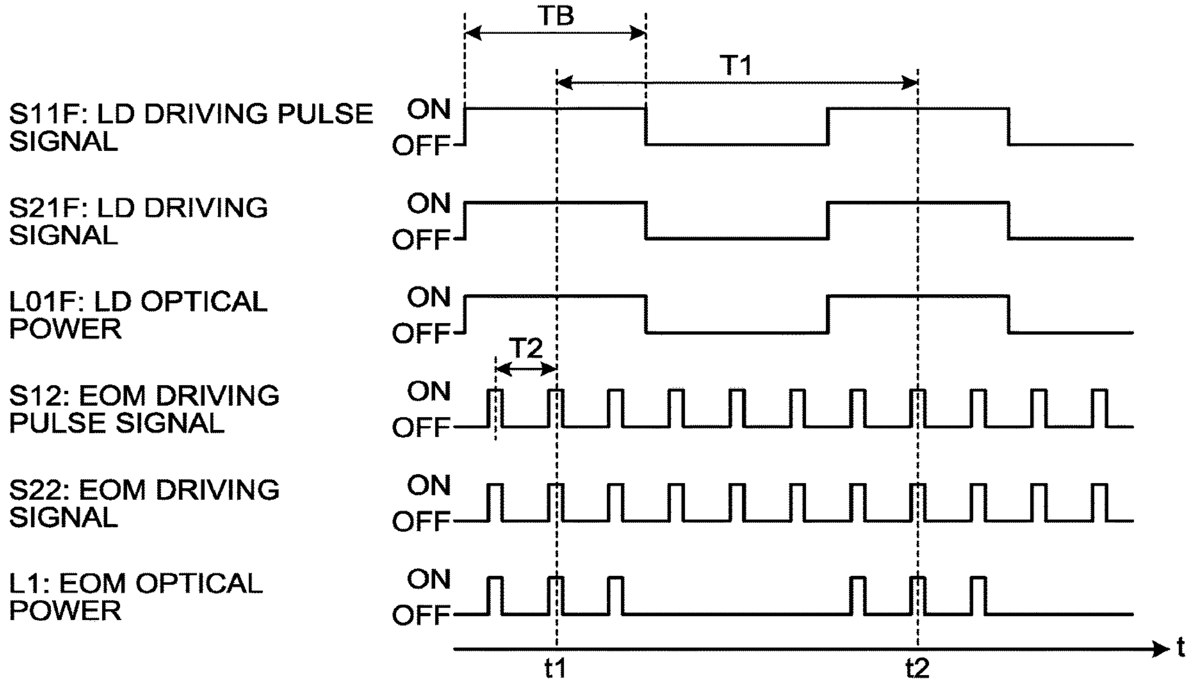
FIG. 25 is a diagram illustrating an example of time charts of signals and optical output for outputting a burst pulse train.

FIG. 25 is a diagram illustrating an example of time charts of signals and optical output for outputting a burst pulse train in the seed light source device 1. An LD driving pulse signal S11F that is output by the control unit 30 to the LD driving unit 21 is a pulse signal that is in the ON state with a pulse width TB, which corresponds to a period in which a desired burst pulse train is generated and which is centered at the times t1 and t2, and is in the OFF state in other periods in a time range illustrated in the figure. The LD driving pulse signal S11F has the repetition period T1 and the same repetition frequency as a repetition frequency of the desired burst pulse train of f1=1/T1. The LD driving signal S21F is a signal that is synchronized with the LD driving pulse signal S11F. Therefore, the laser light L01F (LD optical output) output from the LD 11 also becomes pulsed laser light formed of an optical pulse train that is synchronized with the LD driving pulse signal S11F and the LD driving signal S21F.

In contrast, the EOM driving pulse signal S12 that is output by the control unit 30 to the EOM driving unit 22 has the repetition period T2 that is smaller than T1 and the repetition frequency f2=1/T2, where the repetition frequency corresponds to a pulse interval of the desired burst pulse train. Therefore, the laser light L1 (EOM optical output) output from the EOM 12 becomes a burst pulse train such that an optical pulse train is output at the pulse interval T2 in a period corresponding to the pulse width TB during the burst period T1 and output is turned off in other periods.

In the seed light source device according to the first to fifth embodiments, it is possible to independently control the repetition frequency for driving the LD 11, or the SOA 13 or the AOM 14, if provided, and the repetition frequency for driving the EOM 12, so that it is possible to arbitrarily set a burst period and a pulse interval of the burst pulse train. Further, it is possible to drive the EOM 12 even in a period in which an optical pulse of the burst pulse train is not output, so that it is possible to stably drive the EOM 12 with the increased duty ratio.

(Example of Setting of Pulse Width)

In the pulsed laser device 100 having the MOPA configuration as illustrated in FIG. 1, when a pulse width of seed light (the laser light L1) output from the seed light source device 1 is wide, an influence of a non-linear effect, such as Stimulated Brillouin Scattering (SBS), may become apparent in a single mode optical fiber or in an optical amplifier in a subsequent stage of the seed light source device 1. Such a non-linear effect may cause restriction of output peak power of the laser light L4 that is output from the pulsed laser device 100. In the seed light source devices according to the above-described embodiments, by performing pulse modulation in the EOM 12, the pulsed laser light to be input to the EOM 12 is extracted as pulsed laser light with a smaller pulse width. However, in some cases, even when the EOM 12 is in the OFF state, a part of the pulsed laser light input to the EOM 12 may leak from the EOM 12. Therefore, when the pulse width of the pulsed laser light input to the EOM 12 is large, there may be an influence of the above-described non-linear effect.

To prevent the influence of the non-linear effect as described above, it is preferable to adjust the pulse width of the pulse modulation for the LD 11, or the SOA 13 or the AOM 14, and set the pulse width of the laser light L01, L02, or L03 to be input to the EOM 12 to be equal to or smaller than 3 ns.

Figure 26:
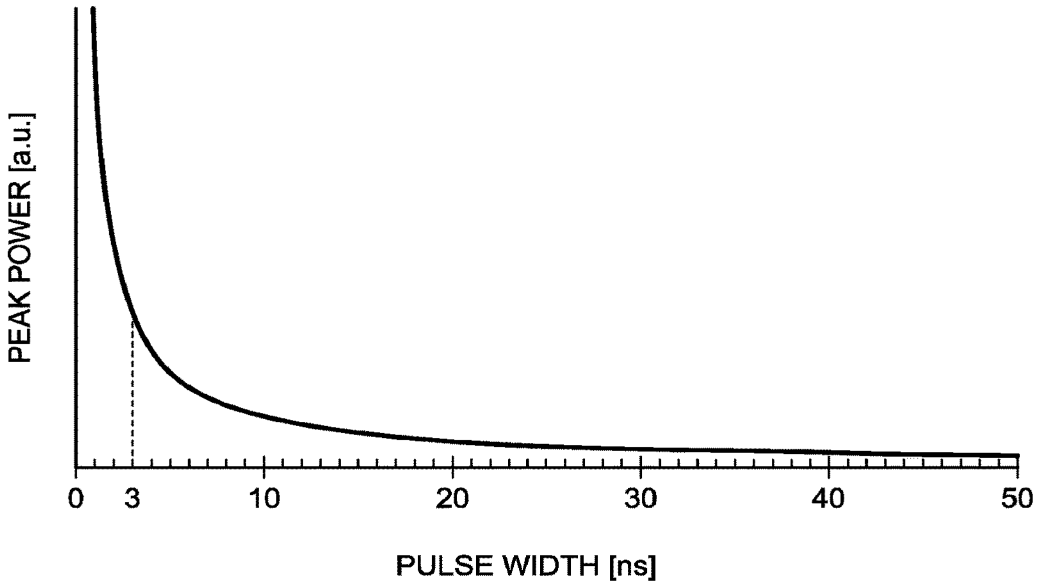
FIG. 26 is a diagram for explaining an example of a relationship between a pulse width of pulsed laser light in a pulsed laser device having an MOPA configuration and output peak power at which Stimulated Brillouin Scattering (SBS) starts to occur.

FIG. 26 is a diagram for explaining an example of a relationship between a pulse width of pulsed laser light in a pulsed laser device having an MOPA configuration as illustrated in FIG. 1 and output peak power at which SBS starts to occur. As illustrated in FIG. 26, when the pulse width is set to be equal to or smaller than 3 ns, output peak power at which the SBS starts to occur increases rapidly, so that it is possible to increase the output peak power while preventing an influence of the SBS.

Sixth Embodiment

Figure 27:
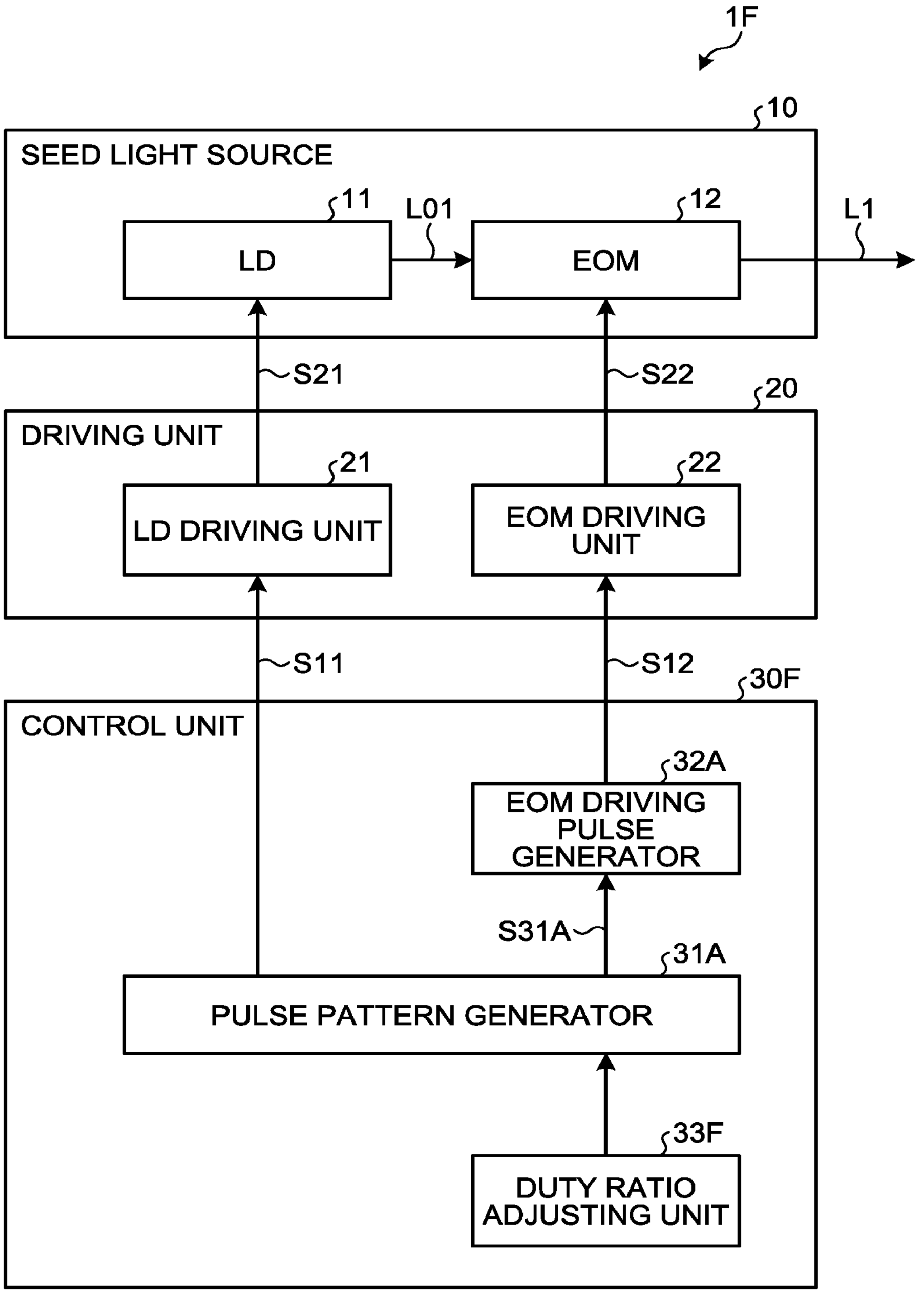
FIG. 27 is a block diagram of a seed light source device according to a sixth embodiment.

FIG. 27 is a block diagram of a seed light source device according to a sixth embodiment. A seed light source device 1F has a configuration obtained by replacing the control unit 30A with a control unit 30F in the configuration of the seed light source device 1A illustrated in FIG. 8. The control unit 30F has a configuration obtained by adding a duty ratio adjusting unit 33F to the configuration of the control unit 30A. The duty ratio adjusting unit 33F adjusts a duty ratio of the EOM driving pulse pattern signal S31A that is output from the pulse pattern generator 31A. Accordingly, the duty ratio of the EOM driving pulse signal S12 output by the EOM driving pulse generator 32A and the duty ratio of the EOM driving signal S22 output by the EOM driving unit 22 are adjusted. With this, the duty ratio of the pulse modulation for the EOM 12 is adjusted. The duty ratio adjusting unit 33F is able to adjust the duty ratio by deriving an optimal driving frequency with respect to the EOM driving unit 22 in accordance with the set pulse width of the pulse modulation for the EOM 12 and by changing a driving frequency of the EOM driving pulse pattern signal S31A output by the pulse pattern generator 31A.

The inventors of the present disclosure have investigated characteristics of the EOM 12 and confirmed that the ON/OFF extinction ratio of the laser light L1 output from the EOM 12 may depend on a duty ratio of a driving voltage signal applied to the EOM 12 (that is, the EOM driving signal S22).

Based on this, in the seed light source device 1F, the duty ratio adjusting unit 33F that adjusts the duty ratio of the EOM driving pulse signal S12 is provided to adjust the ON/OFF extinction ratio of the laser light L1.

Figure 28:
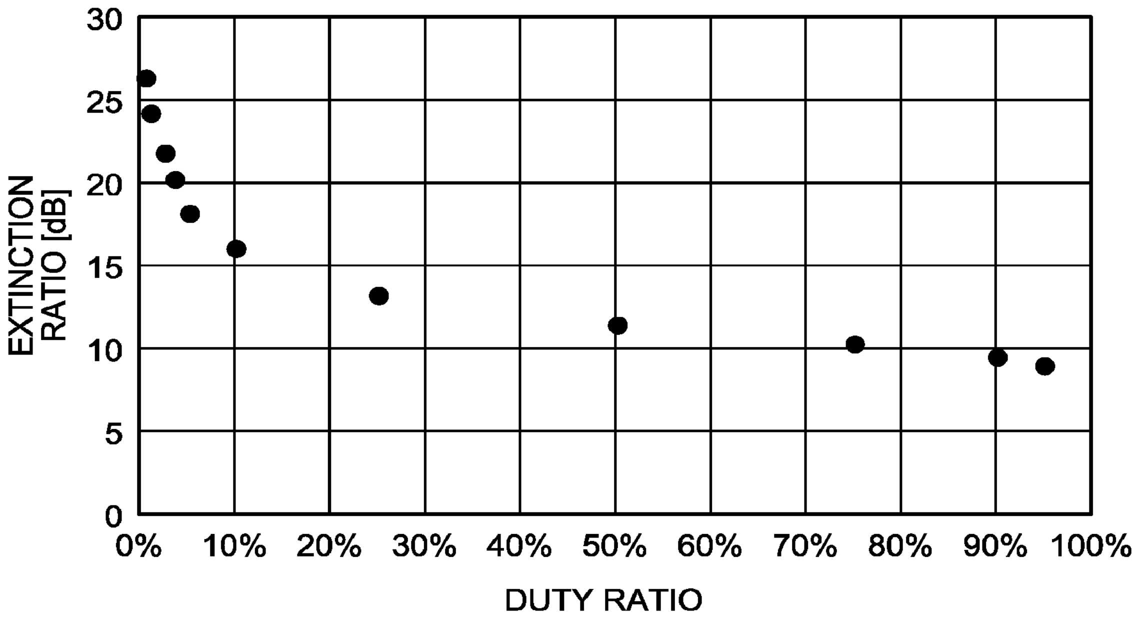
FIG. 28 is a diagram illustrating a relationship between a duty ratio and an ON/OFF extinction ratio.

FIG. 28 is a diagram illustrating an example of a relationship between the duty ratio and the ON/OFF extinction ratio. Specifically, FIG. 28 is a diagram illustrating a relationship between the duty ratio of the EOM driving signal S22 and the ON/OFF extinction ratio of the laser light L1 output by the EOM 12 in a case where the EOM driving unit 22 has the output characteristics as illustrated in FIG. 5. As can be seen in FIG. 5, the amplitude is about 5 V when the duty ratio is 10%, and the amplitude of about 4 V can be ensured even when the duty ratio is close to 0%. Therefore, when the optimal driving voltage of the EOM 12 is about 5 V or smaller, reduction of the driving voltage due to the low duty ratio is less influential even when the duty ratio is 10% or lower. In contrast, in the example in FIG. 28, the ON/OFF extinction ratio increases with a decrease in the duty ratio, and rapidly increases such that the ON/OFF extinction ratio reaches 15 dB or higher when the duty ratio reaches 10% or lower. Meanwhile, these data points can be approximated by $y=-a\times\log(x)+b$ using coefficients a and b, where the duty ratio is denoted by x and the ON/OFF extinction ratio is denoted by y. The coefficients a and b are values that depend on, for example, response characteristics of the EOM 12, the duty ratio of the laser light L01 input to the EOM 12, or the like. In the example in FIG. 28, a=7.663 and b=8.9134. Therefore, in the example illustrated in FIG. 28, to further improve the ON/OFF extinction ratio, it is preferable to set the duty ratio to 10% or lower at which the ON/OFF extinction ratio rapidly increases. With use of the duty ratio as described above, the response characteristics of the EOM 12 can be compensated for.

In a typical EOM driving circuit, an input signal is AC-coupled and then amplified. Therefore, when the duty ratio is large, a change amount of a voltage to the OFF state with respect to 0 V after AC coupling is increased, and there may be a case in which the laser light L1 is not completely quenched when the EOM 12 is in the OFF state. Therefore, in the seed light source device 1F, by setting the duty ratio of the pulse modulation for the EOM 12 to be equal to or lower than 10%, it is possible to improve the ON/OFF extinction ratio. Meanwhile, it is preferable to set a minimum value of the duty ratio to be (a time in which the EOM 12 is in the ON state during a period in which the LD 11 is in the ON state)/(the repetition period T11 of the pulse modulation for the LD 11).

Meanwhile, for example, when an optimal value of the driving voltage of the EOM 12 is larger than 5 V and the ON/OFF extinction ratio can be improved by applying a higher voltage, it may be possible to increase the duty ratio of the EOM driving signal S22 from 10% in order to improve the duty ratio of the pulse modulation for the EOM 12 from 10% so that a high driving voltage for realizing a desired ON/OFF extinction ratio can be applied. By adopting the duty ratio as described above, it is possible to compensate for the amplification characteristic of the EOM driving unit 22.

Seventh Embodiment

Figure 29:
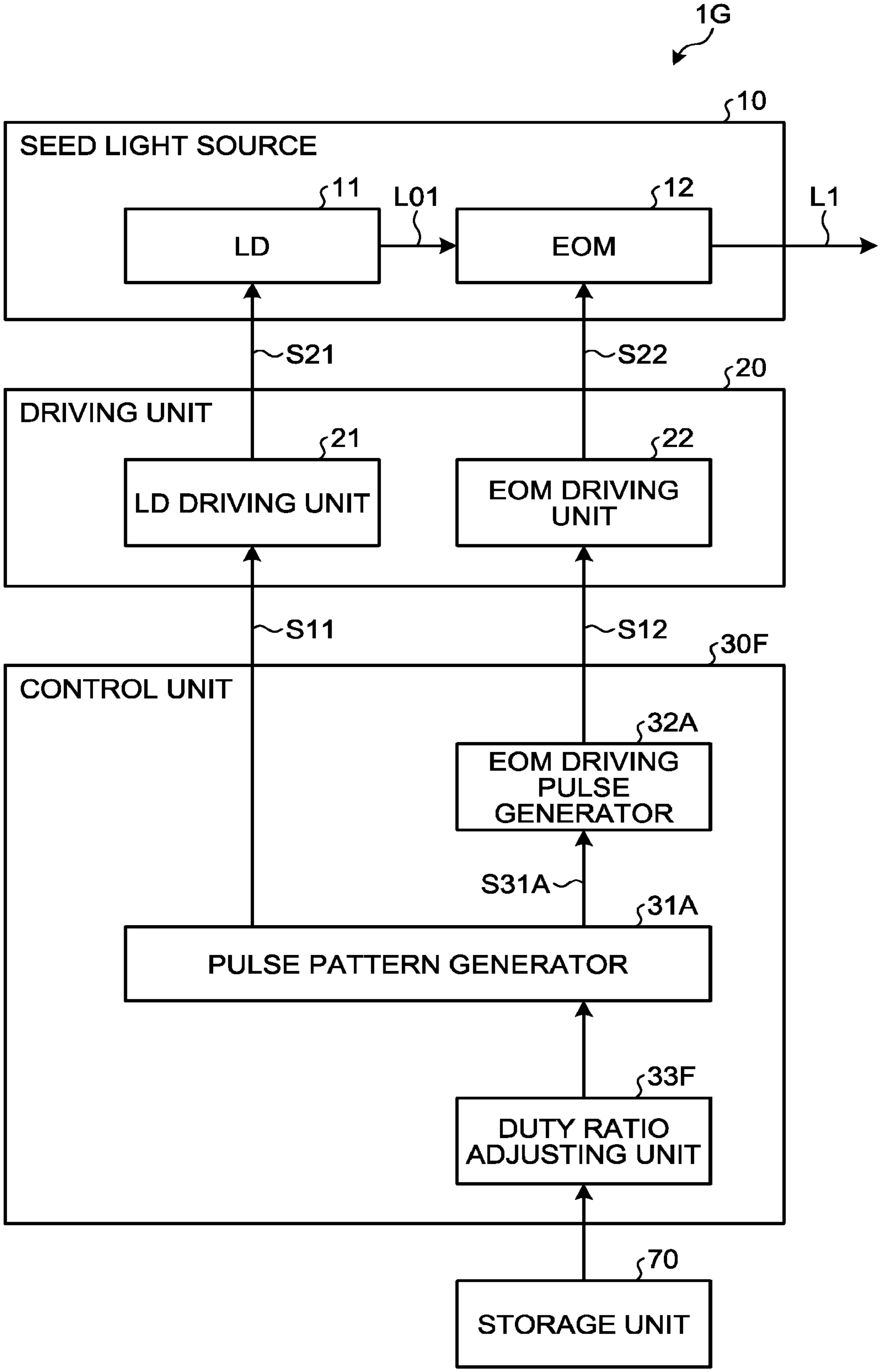
FIG. 29 is a block diagram of a seed light source device according to a seventh embodiment.

FIG. 29 is a block diagram of a seed light source device according to a seventh embodiment. A seed light source device 1G has a configuration obtained by adding a storage unit 70 to the configuration of the seed light source device 1F illustrated in FIG. 27. The storage unit 70 is, for example, a known external storage device, and stores therein, as table data, a duty ratio or a repetition frequency that is set with respect to the pulse modulation for the EOM 12, in association with a set pulse width. The duty ratio adjusting unit 33F reads a value of the duty ratio or the repetition frequency from the storage unit 70 by using the set pulse width of the pulse modulation for the EOM 12 as a parameter, and adjusts the duty ratio of the pulse modulation for the EOM 12 on the basis of the value of the duty ratio or the repetition frequency.

Here, the table data stored in the storage unit 70 is data in which the set pulse width and an optimal duty ratio or an optimal repetition frequency for obtaining a desired ON/OFF extinction ratio with respect to the set pulse width are combined. Therefore, in the seed light source device 1G, it is possible to perform operation at an optimal duty ratio or an optimal repetition frequency for obtaining a desired ON/OFF extinction ratio with respect to the set pulse width.

Eighth Embodiment

Figure 30:
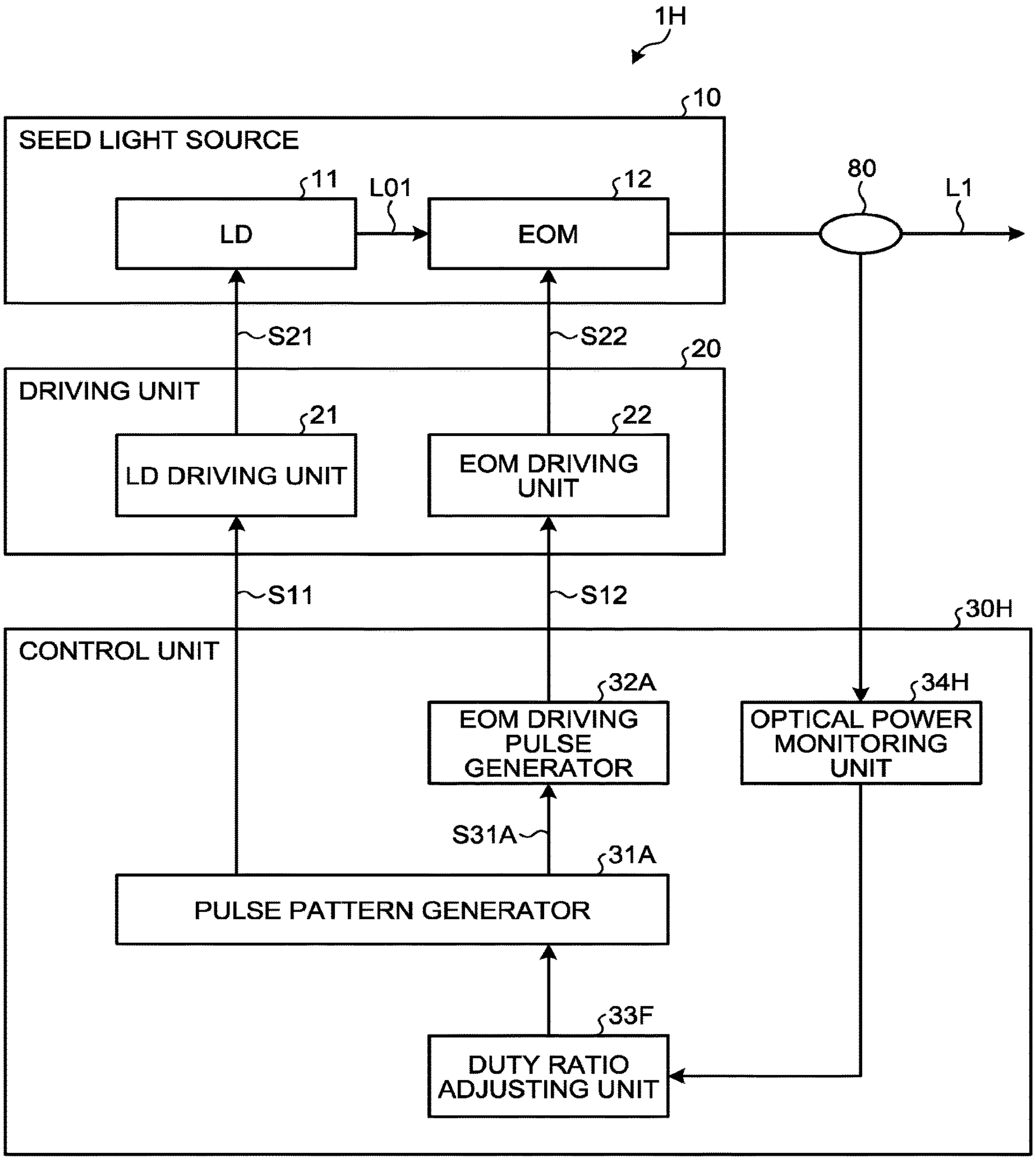
FIG. 30 is a block diagram of a seed light source device according to an eighth embodiment.

FIG. 30 is a block diagram of a seed light source device according to an eighth embodiment. A seed light source device 1H has a configuration obtained by adding an optical coupler 80 and replacing the control unit 30F with a control unit 30H in the configuration of the seed light source device 1F illustrated in FIG. 27. The control unit 30H has a configuration obtained by adding an optical power monitoring unit 34H to the control unit 30F.

The optical coupler 80 branches a part of the laser light L1 output from the EOM 12 and inputs the part of the laser light L1 to the optical power monitoring unit 34H. The optical power monitoring unit 34H monitors an intensity of the laser light L1 output from the EOM 12, on the basis of the intensity of the part of the input laser light L1. The duty ratio adjusting unit 33F adjusts the duty ratio of the pulse modulation for the EOM 12 such that the monitored intensity of the laser light L1 becomes a local minimum value.

In particular, it is preferable that the duty ratio adjusting unit 33F adjusts the duty ratio of the pulse modulation for the EOM 12 such that the intensity monitored by the optical power monitoring unit 34H becomes the local minimum value when the EOM 12 is in the OFF state. With this configuration, it is possible to increase the ON/OFF extinction ratio of the laser light L1.

Ninth Embodiment

Figure 31:
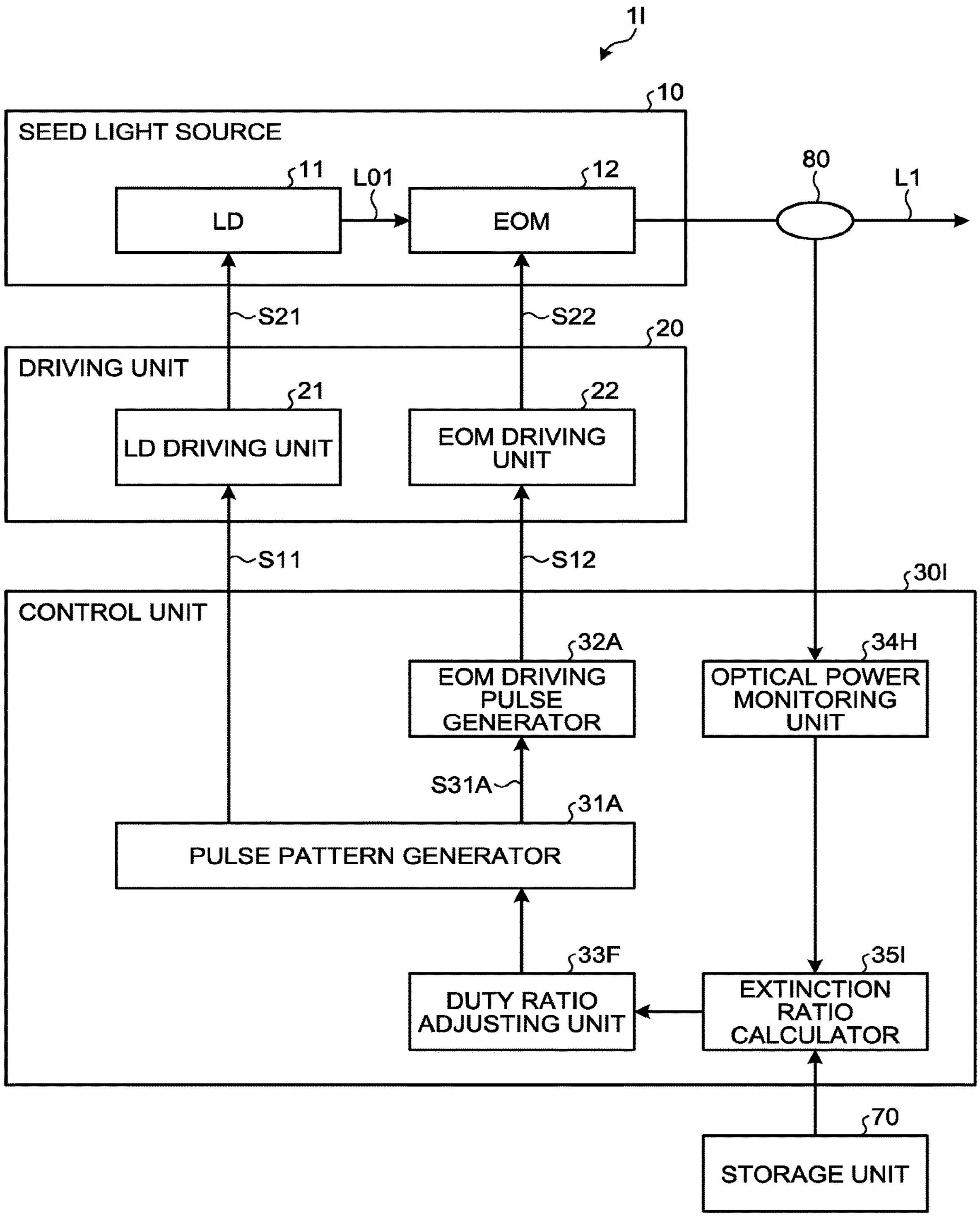
FIG. 31 is a block diagram of a seed light source device according to a ninth embodiment.

FIG. 31 is a block diagram of a seed light source device according to a ninth embodiment. A seed light source device ii has a configuration obtained by replacing the control unit 30H with a control unit 30I and adding the storage unit 70 in the configuration of the seed light source device 1H illustrated in FIG. 30. The control unit 30I has a configuration obtained by adding an extinction ratio calculator 35I to the control unit 30H.

The optical coupler 80 branches a part of the laser light L1 output from the EOM 12 and inputs the part of the laser light L1 to the optical power monitoring unit 34H. The optical power monitoring unit 34H monitors the intensity of the laser light L1 output from the EOM 12, on the basis of the intensity of the part of the input laser light L1. The extinction ratio calculator 35I calculates an ON/OFF extinction ratio of the laser light L1 on the basis of a temporal average value (denoted by $P_{ave}$) of the monitored intensities of laser light L1 and an intensity (denoted by $P_{off}$) that is monitored by the optical power monitoring unit 34H when the EOM 12 is in the OFF state, and outputs a calculation result to the duty ratio adjusting unit 33F. The duty ratio adjusting unit 33F adjusts the duty ratio of the pulse modulation for the EOM 12 on the basis of the calculated ON/OFF extinction ratio. Here, the extinction ratio calculator 35I calculates the ON/OFF extinction ratio (R) based on Equation below.

$$R=1+(T/\tau)\times[(P_{ave}/P_{off})-1]$$

where, T is the repetition period of the laser light L1, and τ is the pulse width of the laser light L1.

Here, the storage unit 70 stores therein, as table data, the ON/OFF extinction ratio that is required for the laser light L1 depending on use conditions or the like, in association with a set pulse width, for example. The duty ratio adjusting unit 33F adjust a value of the duty ratio or the repetition frequency such that the calculated ON/OFF extinction ratio becomes equal to or higher than a desired ON/OFF extinction ratio that is read from the storage unit 70.

Meanwhile, when the laser power L1 has extremely small value due to a failure of the LD 11 or the like, it may be difficult for a determining unit to properly perform comparison. In this case, it may be possible to store a power degradation determination threshold for determining power degradation of the laser power L1 in the storage unit 70 in advance, and perform a process of giving alarm notification when the monitored intensity of the laser light L1 reaches below the power degradation determination threshold.

Tenth Embodiment

Figure 32:
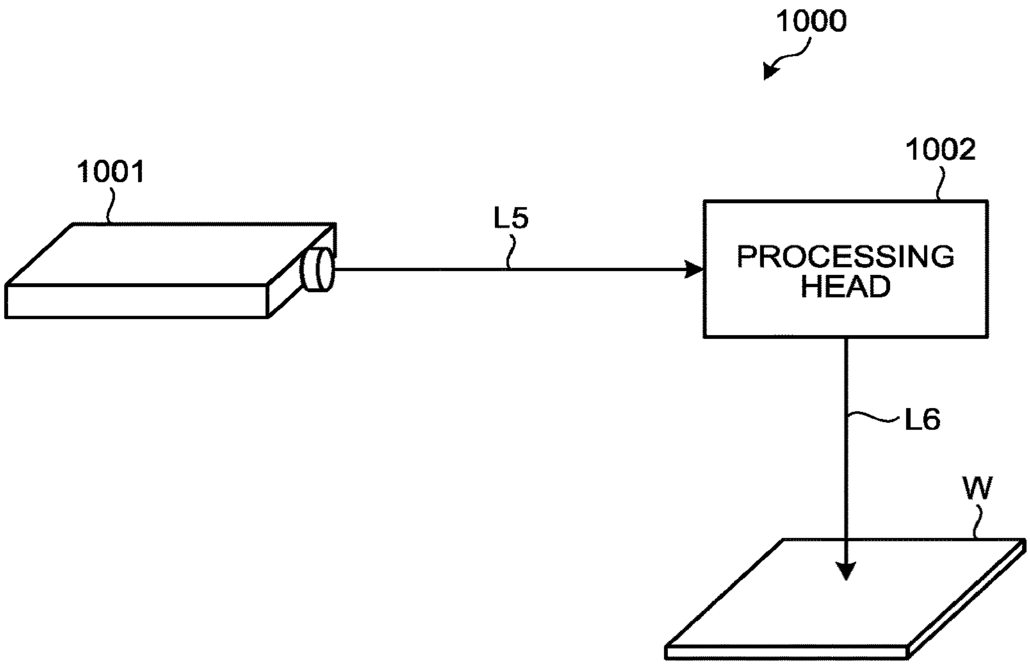
FIG. 32 is a schematic diagram of a processing device according to a tenth embodiment.

FIG. 32 is a schematic diagram of a laser processing device according to a tenth embodiment. A laser processing device 1000 includes a pulsed laser device 1001 and a laser processing head 1002. The pulsed laser device 1001 includes a seed light source device, a preamplifier, and a booster amplifier that are similar to those of the pulsed laser device 100 illustrated in FIG. 1, and outputs pulsed laser light L5. Meanwhile, it is possible to use any of the seed light source devices of the above-described embodiments as the seed light source device of the pulsed laser device 1001. The laser processing head 1002 applies the laser light L5 as pulsed laser light L6 to a work W that is a processing target. Meanwhile, the pulsed laser device 1001 and the laser processing head 1002 may be optically connected via an optical fiber or may be optically connected by a space coupling system. Examples of the processing on the work W include drilling, scribing, precision cutting, precision welding (thin film etc.), surface treatment, and marking.

The laser processing device 1000 as described above is able to output pulsed laser light with a low duty ratio in a preferred manner.

Eleventh Embodiment

Figure 33:
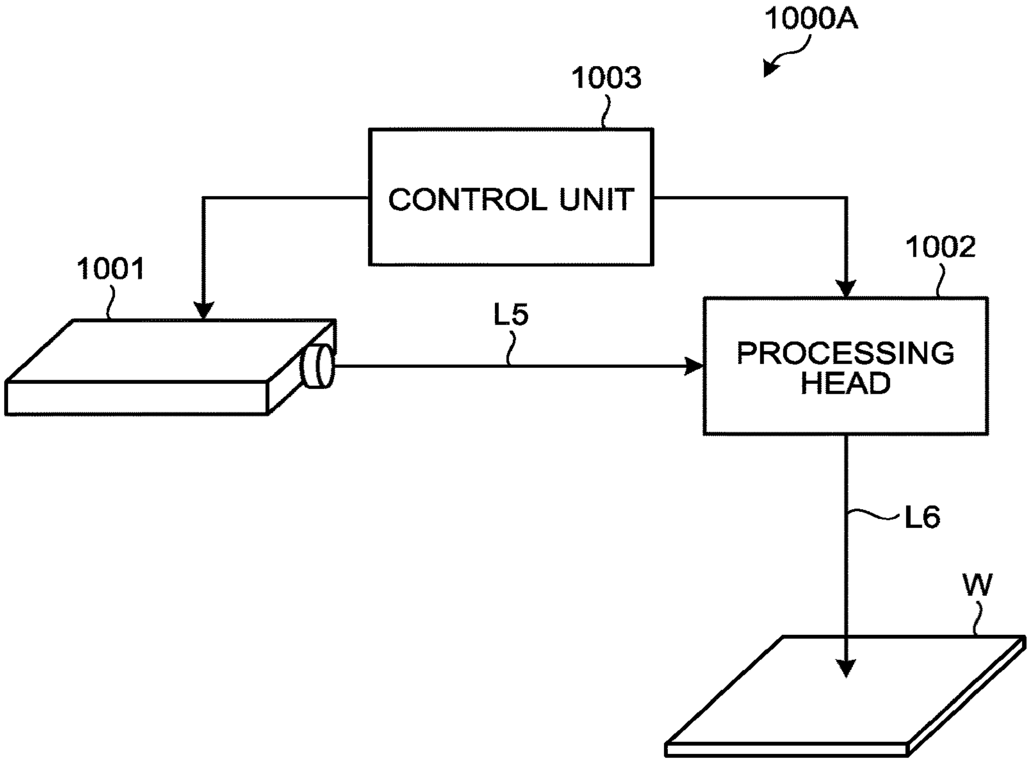
FIG. 33 is a schematic diagram of a processing device according to an eleventh embodiment.

FIG. 33 is a schematic diagram of a laser processing device according to an eleventh embodiment. A laser processing device 1000A has a configuration obtained by adding a control unit 1003 to the laser processing device 1000 illustrated in FIG. 32. The control unit 1003 controls operation of the pulsed laser device 1001 and operation of the laser processing head 1002, and is able to control, for example, the operation of the pulsed laser device 1001 and an emission state of the laser light L6 performed by the laser processing head 1002 in a synchronous manner.

Meanwhile, in the embodiments as described above, a DFB laser element is used as a laser light source that outputs laser light of a single wavelength, but it may be possible to use a Fabry-Perot laser element having an external resonator configuration in which a laser emission wavelength width is reduced using a wavelength selective element, such as an FBG, a Distributed Bragg Reflector (DBR) laser element, a Distributed Reflector (DR) laser element, or other laser light sources. Further, it may be possible to use, as a laser light source, a laser light source that outputs laser light of multiple wavelengths, such as a multi-mode laser light source, instead of a single wavelength.

Furthermore, the present disclosure is not limited by the embodiments described above. The present disclosure includes configurations obtained by appropriately combining the above-descried components. For example, the seed light source devices according to the second to fifth embodiments may be adopted as a seed light source device of the pulsed laser device according to the first embodiment. Moreover, it may be possible to apply the configuration of the control unit including the pulse pattern generator of the second embodiment or the control unit including the pulse pattern generator and the reference clock generator of the third embodiment to the configuration including the SOA of the fourth embodiment or the configuration including the AOM of the fifth embodiment. In this case, the pulse pattern generator is configured so as to generate and output a pulse pattern signal to be used to perform pulse modulation in at least one of the LD, the SOA, and the AOM. Furthermore, it may be possible to apply any one of the configurations illustrated in FIGS. 17A, 17B, 18A, 18B, 19A, and 19B to the configuration of the control unit including the pulse pattern generator and the reference clock generator of the third embodiment, the configuration including the SOA of the fourth embodiment, or the configuration including the AOM of the fifth embodiment, and output the EOM driving pulse signal as illustrated in FIGS. 7A, 7B, and 7C. Moreover, additional advantageous effects and modifications will readily occur to those skilled in the art. Therefore, the disclosure in its broader aspects is not limited to the specific details and representative embodiments shown and described herein and various modifications may be made.

According to the present disclosure, it is possible to realize a pulsed laser device capable of outputting pulsed laser light with a low duty ratio in a preferred manner.

What is claimed is:

1. A pulsed laser device comprising:

a laser light source;

an electro-optic modulator;

a laser light source driving unit that drives the laser light source by pulse modulation;

an electro-optic modulator driving unit that drives the electro-optic modulator by pulse modulation; and a control unit that controls the laser light source driving unit and the electro-optic modulator driving unit, wherein the laser light source outputs pulsed laser light pulse-modulated by the laser light source driving unit, the electro-optic modulator outputs pulsed laser light that is obtained by causing the electro-optic modulator driving unit to pulse-modulate the pulsed laser light that is output by the laser light source, and the control unit controls the laser light source driving unit and the electro-optic modulator driving unit so as to realize pulse modulation for the laser light source and pulse modulation for the electro-optic modulator such that the electro-optic modulator transitions to an ON state at least while the laser light source is in an ON state and such that the electro-optic modulator transitions to the ON state at least once while the laser light source is in an OFF state, to thereby increase a duty ratio of the pulse modulation for the electro-optic modulator relative to a duty ratio of the pulse modulation for the laser light source.

2. The pulsed laser device according to claim 1, wherein the control unit controls the laser light source driving unit and the electro-optic modulator driving unit such that a repetition frequency of the pulse modulation for the electro-optic modulator becomes constant and the repetition frequency becomes larger than a repetition frequency of the pulse modulation for the laser light source.

3. The pulsed laser device according to claim 2, wherein, assuming that N is an integer equal to or larger than 2, the repetition frequency of the pulse modulation for the electro-optic modulator is N times larger than the repetition frequency of the pulse modulation for the laser light source.

4. The pulsed laser device according to claim 1, wherein a pulse width of the pulse modulation for the electro-optic modulator is smaller than a pulse width of the pulse modulation for the laser light source when the laser light source is in the ON state.

5. The pulsed laser device according to claim 1, wherein the control unit adjusts a pulse width of pulse modulation for one of the laser light source, the semiconductor optical amplifier, and the acousto-optic modulator, and sets a pulse width of laser light to be input to the electro-optic modulator to be equal to or smaller than 3 ns.

6. The pulsed laser device according to claim 1, wherein the control unit adjusts a pulse width of pulse modulation for one of the laser light source, the semiconductor optical amplifier, and the acousto-optic modulator, to thereby set a pulse width of laser light to be input to the electro-optic modulator to a pulse width that corresponds to a period in which a desired burst pulse train is generated and set a repetition frequency of the laser light to a repetition frequency of a desired burst pulse train, and sets a repetition frequency of the electro-optic modulator driving pulse signal to a repetition frequency that corresponds to a pulse interval of the desired burst pulse train.

7. The pulsed laser device according to claim 1, further comprising an optical amplifier that receives the pulsed laser light output from the electro-optic modulator, and amplifies and outputs the pulsed laser light.

8. The pulsed laser device according to claim 1, further comprising a duty ratio adjusting unit that adjusts the duty ratio of the pulse modulation for the electro-optic modulator.

9. A processing device comprising:

the pulsed laser device according to claim 1; and a processing head that applies pulsed laser light output from the pulsed laser device to a processing target.

10. A method of controlling a pulsed laser device that includes a laser light source and an electro-optic modulator, wherein the laser light source outputs pulsed laser light pulse-modulated and the electro-optic modulator outputs pulsed laser light that is obtained by performing pulse modulation on the pulsed laser light that is output from the laser light source, the method comprising:

realizing pulse modulation for the laser light source and pulse modulation for the electro-optic modulator such that the electro-optic modulator transitions to an ON state at least while the laser light source is in the ON state;

causing the electro-optic modulator to transition to the ON state at least once while the laser light source is in an OFF state; and increasing a duty ratio of the pulse modulation for the electro-optic modulator relative to a duty ratio of the pulse modulation for the laser light source.

11. A pulsed laser device comprising:

a laser light source;

a semiconductor optical amplifier;

an electro-optic modulator;

a laser light source driving unit that drives the laser light source;

a semiconductor optical amplifier driving unit that drives the semiconductor optical amplifier by pulse modulation;

an electro-optic modulator driving unit that drives the electro-optic modulator by pulse modulation; and a control unit that controls the laser light source driving unit, the semiconductor optical amplifier driving unit, and the electro-optic modulator driving unit, wherein the laser light source outputs laser light, the semiconductor optical amplifier outputs pulsed laser light that is obtained by causing the semiconductor optical amplifier driving unit to perform pulse modulation on the laser light, the electro-optic modulator outputs pulsed laser light that is obtained by causing the electro-optic modulator driving unit to pulse-modulate the pulsed laser light that is output by the semiconductor optical amplifier, and the control unit controls the semiconductor optical amplifier driving unit and the electro-optic modulator driving unit so as to realize pulse modulation for the semiconductor optical amplifier and pulse modulation for the electro-optic modulator such that the electro-optic modulator transitions to an ON state at least while the semiconductor optical amplifier is in an ON state and such that the electro-optic modulator transitions to the ON state at least once while the semiconductor optical amplifier is in an OFF state, to thereby increase a duty ratio of the pulse modulation for the electro-optic modulator relative to a duty ratio of the pulse modulation for the semiconductor optical amplifier.

12. The pulsed laser device according to claim 11, wherein the control unit controls the semiconductor optical amplifier driving unit and the electro-optic modulator driving unit such that a repetition frequency of the pulse modulation for the electro-optic modulator becomes constant and the repetition frequency becomes larger than a repetition frequency of the pulse modulation for the semiconductor optical amplifier.

13. The pulsed laser device according to claim 12, wherein, assuming that N is an integer equal to or larger than 2, the repetition frequency of the pulse modulation for the electro-optic modulator is N times larger than the repetition frequency of the pulse modulation for the semiconductor optical amplifier.

14. The pulsed laser device according to claim 11, wherein a pulse width of the pulse modulation for the electro-optic modulator is smaller than a pulse width of the pulse modulation for the semiconductor optical amplifier when the semiconductor optical amplifier is in the ON state.

15. A method of controlling a pulsed laser device that includes a laser light source, a semiconductor optical amplifier, and an electro-optic modulator, wherein the laser light source outputs laser light, the semiconductor optical amplifier outputs pulsed laser light that is obtained by performing pulse modulation on the laser light output from the laser light source, and the electro-optic modulator outputs pulsed laser light that is obtained by performing pulse modulation on the pulsed laser light output from the semiconductor optical amplifier, the method comprising:

realizing pulse modulation for the semiconductor optical amplifier and pulse modulation for the electro-optic modulator such that the electro-optic modulator transitions to an ON state at least while the semiconductor optical amplifier is in an ON state;

causing the electro-optic modulator to transition to the ON state at least once while the semiconductor optical amplifier is in an OFF state; and increasing a duty ratio of the pulse modulation for the electro-optic modulator relative to a duty ratio of the pulse modulation for the semiconductor optical amplifier.

16. A pulsed laser device comprising:

a laser light source;

an acousto-optic modulator;

an electro-optic modulator;

a laser light source driving unit that drives the laser light source;

an acousto-optic modulator driving unit that drives the acousto-optic modulator by pulse modulation;

an electro-optic modulator driving unit that drives the electro-optic modulator by pulse modulation; and a control unit that controls the laser light source driving unit, the acousto-optic modulator driving unit, and the electro-optic modulator driving unit, wherein the laser light source outputs laser light, the acousto-optic modulator outputs pulsed laser light that is obtained by causing the acousto-optic modulator driving unit to perform pulse modulation on the laser light, the electro-optic modulator outputs pulsed laser light that is obtained by causing the electro-optic modulator driving unit to pulse-modulate the pulsed laser light that is output by the acousto-optic modulator, and the control unit controls the acousto-optic modulator driving unit and the electro-optic modulator driving unit so as to realize pulse modulation for the acousto-optic modulator and pulse modulation for the electro-optic modulator such that the electro-optic modulator transitions to an ON state at least while the acousto-optic modulator is in an ON state and such that the electro-optic modulator transitions to the ON state at least once while the acousto-optic modulator is in an OFF state, to thereby increase a duty ratio of the pulse modulation for the electro-optic modulator relative to a duty ratio of the pulse modulation for the acousto-optic modulator.

17. The pulsed laser device according to claim 16, wherein the control unit controls the acousto-optic modulator driving unit and the electro-optic modulator driving unit such that a repetition frequency of the pulse modulation for the electro-optic modulator becomes constant and the repetition frequency becomes larger than a repetition frequency of the pulse modulation for the acousto-optic modulator.

18. The pulsed laser device according to claim 17, wherein, assuming that N is an integer equal to or larger than 2, the repetition frequency of the pulse modulation for the electro-optic modulator is N times larger than the repetition frequency of the pulse modulation for the acousto-optic modulator.

19. The pulsed laser device according to claim 16, wherein a pulse width of the pulse modulation for the electro-optic modulator is smaller than a pulse width of the pulse modulation for the acousto-optic modulator when the acousto-optic modulator is in the ON state.

20. The pulsed laser device according to claim 11, wherein the laser light source driving unit drives the laser light source by pulse modulation, and the control unit controls the laser light source driving unit and the electro-optic modulator driving unit so as to realize pulse modulation for the laser light source and the pulse modulation for the electro-optic modulator such that the electro-optic modulator transitions to the ON state at least while the laser light source is in an ON state.

* * * * *